US012813045B2

(12) United States Patent
Wang et al.

(10) Patent No.: US 12,813,045 B2
(45) Date of Patent: Nov. 24, 2026

(54) DISPLAY PANEL AND METHOD FOR MANUFACTURING THE SAME, DISPLAY DEVICE AND TILED DISPLAY APPARATUS

(71) Applicants: BOE MLED Technology Co., Ltd., Beijing (CN); BOE TECHNOLOGY GROUP CO., LTD., Beijing (CN)

(72) Inventors: Lili Wang, Beijing (CN); Jing Wang, Beijing (CN); Chao Liu, Beijing (CN); Sha Feng, Beijing (CN); Ming Zhai, Beijing (CN); Qi Qi, Beijing (CN)

(73) Assignees: BOE MLED TECHNOLOGY CO., LTD., Beijing (CN); BOE TECHNOLOGY GROUP CO. , LTD., Beijing (CN)

( * ) Notice: Subject to any disclaimer, the term of this patent is extended or adjusted under 35 U.S.C. 154(b) by 359 days.

(21) Appl. No.: 18/293,260

(22) PCT Filed: Dec. 19, 2022

(86) PCT No.: PCT/CN2022/140148

§ 371 (c)(1),
(2) Date: Jan. 29, 2024

(87) PCT Pub. No.: WO2024/130514

PCT Pub. Date: Jun. 27, 2024

(65) Prior Publication Data

US 2025/0098383 A1 Mar. 20, 2025

(51) Int. Cl.
*H10H 20/857* (2025.01)
*H10W 42/60* (2026.01)
(Continued)

(52) U.S. Cl.
CPC .......... *H10H 20/857* (2025.01); *H10W 42/60* (2026.01); *H10W 90/00* (2026.01); *H10H 20/0364* (2025.01)

(58) Field of Classification Search
CPC .. H10D 86/0241; H10D 86/441; H10D 86/60; H10D 89/921; H10D 89/931;
(Continued)

(56) References Cited

U.S. PATENT DOCUMENTS

| | | | | |
|---|---|---|---|---|
| 12,278,244 B2 * | 4/2025 | Gong | ...................... | G09F 9/302 |
| 2020/0388636 A1 * | 12/2020 | Yueh | ...................... | G06F 1/1637 |

(Continued)

FOREIGN PATENT DOCUMENTS

| | | |
|---|---|---|
| CN | 103926719 A | 7/2014 |
| CN | 107045409 A | 8/2017 |

(Continued)

*Primary Examiner* — Omar F Mojaddedi
(74) *Attorney, Agent, or Firm* — XSENSUS LLP

(57) ABSTRACT

A display panel includes a substrate, a plurality of connection wires, an isolation region and a first electrostatic discharge structure disposed on a second surface. The substrate includes a first surface and a second surface that are opposite, and a plurality of side surfaces, and at least one of the side surfaces is a selected side surface. The connection wires are arranged side by side at intervals, and each of the connection wires includes a first-segment wire, a second-segment wire and a third-segment wire connected in sequence. The first-segment wire is located on the first surface, the second-segment wire is located on the selected side surface, and the third-segment wire is located on the second surface. The first electrostatic discharge structure is arranged on a side of third-segment wires away from the selected side surface. The isolation region is located between the third-segment wires and the first electrostatic discharge structure.

20 Claims, 24 Drawing Sheets

(51) Int. Cl.
*H10W 90/00* (2026.01)
*H10H 20/01* (2025.01)

(58) Field of Classification Search
CPC ......... G09F 9/302; G09F 9/33; H10H 20/856; H10H 20/0363; H10H 20/857; H10H 20/0364; H10H 29/0364; H10H 29/49; H10H 29/10; H10W 42/60; H10W 90/00; G09G 3/32; G09G 3/3233; G09G 3/3266
See application file for complete search history.

(56) References Cited

U.S. PATENT DOCUMENTS

| | | | | |
|---|---|---|---|---|
| 2021/0217353 | A1* | 7/2021 | Zhao | H10D 86/441 |
| 2021/0328118 | A1 | 10/2021 | Jiang | |
| 2021/0343758 | A1* | 11/2021 | Zhang | H10K 59/82 |
| 2022/0052241 | A1* | 2/2022 | Lu | H10H 20/857 |

FOREIGN PATENT DOCUMENTS

| | | | |
|---|---|---|---|
| CN | 110703479 | A | 1/2020 |
| CN | 110853572 | A | 2/2020 |
| CN | 113903273 | A | 1/2022 |
| CN | 114122009 | A | 3/2022 |
| CN | 115460764 | A | 12/2022 |
| JP | 2008-123777 | A | 5/2008 |
| JP | 2009-246093 | A | 10/2009 |

* cited by examiner

DISPLAY PANEL AND METHOD FOR MANUFACTURING THE SAME, DISPLAY DEVICE AND TILED DISPLAY APPARATUS

CROSS-REFERENCE TO RELATED APPLICATION

This application is a national phase entry under 35 USC 371 of International Patent Application No. PCT/CN2022/140148 filed on Dec. 19, 2022, which is incorporated herein by reference in its entirety.

TECHNICAL FIELD

The present disclosure relates to the field of display technologies, and in particular, to a display panel, a method for manufacturing a display panel, a display device and a tiled display apparatus.

BACKGROUND

Mini light-emitting diode (Mini LED) display devices and micro light-emitting diode (Micro LED) display devices have self-luminous display characteristics, and their advantages include all solid state, long service life, high brightness, low power consumption, small size, ultra-high resolution, etc.

Since the mass transfer process of Mini LED chips in the Mini LED display devices and Micro LED chips in the Micro LED display devices is relatively difficult, it is relatively difficult to directly fabricate large-sized display devices. Therefore, a plurality of small-sized Mini LED display devices or a plurality of small-size Micro LED display devices are usually tiled to achieve the fabrication of a large-sized display apparatus.

SUMMARY

In an aspect, a display panel is provided. The display panel includes: a substrate, a plurality of connection wires, a first electrostatic discharge structure and an isolation region. The substrate includes a first surface and a second surface that are opposite, and a plurality of side surfaces connecting the first surface and the second surface. At least one side surface in the plurality of side surfaces is a selected side surface. The plurality of connection wires are arranged side by side at intervals; each connection wire in the plurality of connection wires includes a first-segment wire, a second-segment wire and a third-segment wire connected in sequence; the first-segment wire is located on the first surface, the second-segment wire is located on the selected side surface, and the third-segment wire is located on the second surface. The first electrostatic discharge structure is disposed on the second surface, and the first electrostatic discharge structure is arranged on a side of a plurality of third-segment wires of the plurality of connection wires away from the selected side surface. The second surface includes an isolation region, the isolation region is located between the plurality of third-segment wires and the first electrostatic discharge structure, and the isolation region is configured to separate the plurality of connection wires from the first electrostatic discharge structure, so that the plurality of connection wires are electrically isolated from the first electrostatic discharge structure.

In some embodiments, the third-segment wires of the plurality of connection wires are arranged in the first direction, and the isolation region extends in the first direction. Ends of the third-segment wires away from the selected side surface are bonding ends, and a dimension of the isolation region in the first direction is greater than or equal to a distance between a side of a first bonding end away from a second bonding end and a side of the second bonding end away from the first bonding end in the first direction. The first bonding end and the second bonding end are bonding ends of two third-segment wires that are farthest apart, respectively.

In some embodiments, the dimension of the isolation region in the first direction is equal to a dimension of the second surface in the first direction.

In some embodiments, a dimension of the isolation region in the second direction is equal to a distance between two adjacent third-segment wires, and the second direction is perpendicular to the first direction.

In some embodiments, the dimension of the isolation region in the second direction is in a range of 10 μm to 2 mm.

In some embodiments, a dimension of the isolation region in the second direction is greater than a distance between two adjacent third-segment wires, and the second direction is perpendicular to the first direction.

In some embodiments, the dimension of the isolation region in the second direction is in a range of 300 μm to 2 mm.

In some embodiments, a thickness of the first electrostatic discharge structure is approximately equal to a thickness of the third-segment wire.

In some embodiments, the display panel further includes at least one second electrostatic discharge structure disposed on the second surface. There are two second electrostatic discharge structures, and the two second electrostatic discharge structures are located on both sides of the plurality of third-segment wires in the first direction and are electrically isolated from the third-segment wires; or there are one second electrostatic discharge structure, and the second electrostatic discharge structure is located on any side of the plurality of third-segment wires in the first direction and is electrically isolated from the third-segment wires.

In some embodiments, a dimension of the isolation region in the first direction is greater than or equal to a dimension of bonding ends of the plurality of third-segment wires in the first direction, and is less than a dimension of the second surface in the first direction. The at least one second electrostatic discharge structure is connected to the first electrostatic discharge structure.

In some embodiments, thicknesses of the first electrostatic discharge structure, the at least one second electrostatic discharge structure, and the third-segment wire are all substantially equal.

In some embodiments, the display panel further includes a plurality of first electrodes and at least one set of alignment marks disposed on the first surface of the substrate, and each set of alignment marks includes two alignment marks. The plurality of first electrodes are arranged in the first direction, each first electrode is electrically connected to a corresponding first-segment wire, and the two alignment marks in each set of alignment marks are located on both sides of the plurality of first electrodes in the first direction, respectively. The second surface is provided with at least two mark exposure regions, each of the at least two mark exposure regions corresponds to an alignment mark in position, and an orthographic projection of the alignment mark on the second surface is located within the mark exposure region; and the mark exposure region exposes the second surface.

In some embodiments, the mark exposure region communicates with the isolation region.

In some embodiments, the display panel further includes a conductive adhesive and a flexible printed circuit. The conductive adhesive is disposed on a side of the isolation region proximate to the selected side surface, and the flexible printed circuit is disposed on a side of the conductive adhesive away from the substrate. The flexible printed circuit includes a plurality of bonding terminals, and each of the plurality of bonding terminals is electrically connected to a bonding end of one of the plurality of third-segment wires through the conductive adhesive. Orthographic projections of the plurality of bonding terminals on the second surface are non-overlapping with an orthographic projection of the first electrostatic discharge structure on the second surface.

In some embodiments, a dimension of the conductive adhesive in the first direction is greater than or equal to a distance between the side of the first bonding end away from the second bonding end and the side of the second bonding end away from the first bonding end in the first direction; and a dimension of the conductive adhesive in a second direction is in a range of 1 mm to 2 mm. The second direction is perpendicular to the first direction.

In some embodiments, the display panel further includes a second electrostatic discharge structure, and an orthographic projection of the second electrostatic discharge structure on the second surface is non-overlapping with an orthographic projection of the conductive adhesive on the second surface.

In some embodiments, orthographic projections of the plurality of bonding terminals on the second surface are non-overlapping with the orthographic projection of the second electrostatic discharge structure on the second surface.

In another aspect, a display device is provided. The display device includes the display panel as described in any one of the above embodiments and a driving circuit board disposed on the second surface of the substrate of the display panel. The driving circuit board is electrically connected to the plurality of connection wires of the display panel.

In yet another aspect, a tiled display apparatus is provided. The tiled display apparatus includes a plurality of display devices each described in any one of the above embodiments, and the plurality of display devices are tiled together.

In yet another aspect, a method for manufacturing a display panel is provided. The method includes:

providing a substrate; the substrate including a first surface and a second surface that are opposite, and a plurality of side surfaces connecting the first surface and the second surface, at least one side surface in the plurality of side surfaces being a selected side surface; and the second surface including an isolation region; and forming a plurality of connection wires on the first surface, the second surface and the selected side surface of the substrate, and forming a first electrostatic discharge structure on the second surface. The plurality of connection wires are arranged side by side at intervals; each connection wire in the plurality of connection wires includes a first-segment wire, a second-segment wire and a third-segment wire connected in sequence, the first-segment wire is located on the first surface, the second-segment wire is located on the selected side surface, and the third-segment wire is located on the second surface. The first electrostatic discharge structure is located on the second surface, and the first electrostatic discharge structure is arranged on a side of a plurality of third-segment wires of the plurality of connection wires away from the selected side surface. The isolation region is located between the plurality of third-segment wires and the first electrostatic discharge structure, and the isolation region is configured to separate the plurality of connection wires from the first electrostatic discharge structure, so that the plurality of connection wires are electrically isolated from the first electrostatic discharge structure.

In some embodiments, forming the plurality of connection wires on the first surface, the second surface and the selected side surface of the substrate, and forming the first electrostatic discharge structure, includes: forming a metal layer on the selected side surface, the second surface and a portion, close to the selected side surface, of the first surface of the substrate; and etching the metal layer to form the plurality of connection wires and the first electrostatic discharge structure. The second surface includes a first region, the isolation region, and a second region arranged in sequence in a direction away from the selected side surface; and etching the metal layer includes removing a portion of the metal layer located in the isolation region by etching, a portion of the metal layer located in the second region serving as the first electrostatic discharge structure. Alternatively, forming the plurality of connection wires on the first surface, the second surface and the selected side surface of the substrate, and forming the first electrostatic discharge structure, includes: placing a mask on the second surface of the substrate, the second surface including the first region, the isolation region, and the second region arranged in sequence in the direction away from the selected side surface, and the mask being arranged on the isolation region; forming the metal layer on the selected side surface, the second surface and the portion, close to the selected side surface, of the first surface of the substrate; etching portions of the metal layer located on the first surface, the selected side surface and the first region of the second surface to form the plurality of connection wires; and removing the mask, the portion of the metal layer located in the second region serving as the first electrostatic discharge structure.

BRIEF DESCRIPTION OF THE DRAWINGS

In order to describe technical solutions in the present disclosure more clearly, the accompanying drawings to be used in some embodiments of the present disclosure will be introduced briefly; Obviously, the accompanying drawings to be described below are merely drawings of some embodiments of the present disclosure, and a person of ordinary skill in the art can obtain other drawings according to these accompanying drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
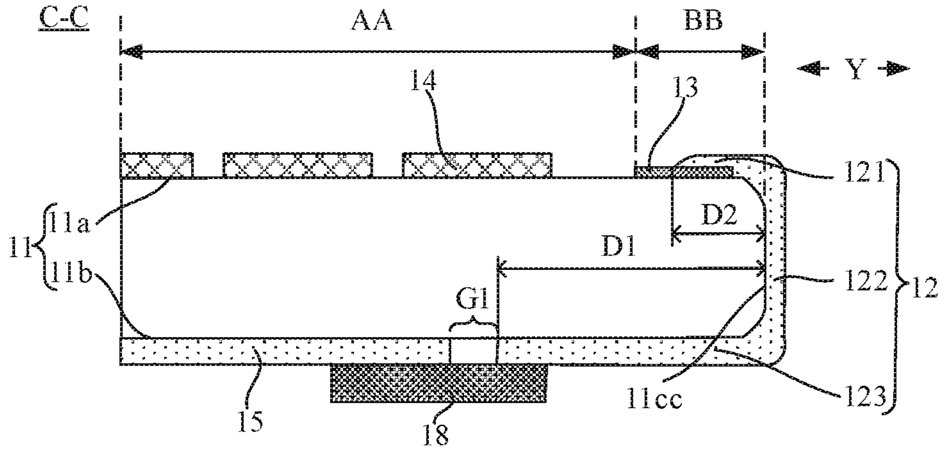
FIG. 1 is a sectional view of a display panel, in accordance with some embodiments.

The technical solutions in some embodiments of the present disclosure will be described clearly and completely with reference to the accompanying drawings; however, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example", or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating the number of indicated technical features. Thus, a feature defined with "first" or "second" may explicitly or implicitly include one or more of the features. In the description of the embodiments of the present disclosure, the term "a/the plurality of" means two or more unless otherwise specified.

In the description of some embodiments, the expressions "coupled", "connected", and derivatives thereof may be used. The term "connected" should be understood in a broad sense. For example, the term "connected" may represent a fixed connection, a detachable connection, or a one-piece connection, or may represent a direct connection, or may represent an indirect connection through an intermediate medium. The term "coupled", for example, indicates that two or more components are in direct physical or electrical contact with each other. The term "coupled" or "communicatively coupled" may also mean that two or more components are not in direct contact with each other but still cooperate or interact with each other. The embodiments disclosed herein are not necessarily limited to the content herein.

The phrase "at least one of A, B, and C" has the same meaning as the phrase "at least one of A, B, or C", both including the following combinations of A, B, and C: only A, only B, only C, a combination of A and B, a combination of A and C, a combination of B and C, and a combination of A, B, and C.

The phrase "A and/or B" includes following three combinations: only A, only B, and a combination of A and B.

The phrase "applicable to" or "configured to" used herein means an open and inclusive expression, which does not exclude devices that are applicable to or configured to perform additional tasks or steps.

The term "about", "substantially", and "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "parallel", "perpendicular", or "equal" as used herein includes a stated condition and a condition similar to the stated condition. A range of the similar condition is within an acceptable range of deviation, and the acceptable range of deviation is determined by a person of ordinary skill in the art, considering measurement in question and errors associated with measurement of a particular quantity (i.e., the limitations of a measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. And the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in devices, and are not intended to limit the scope of the exemplary embodiments.

In order to improve product reliability and reduce transportation costs and maintenance costs, a large-sized display apparatus can be assembled by tiling a plurality of small-sized display devices.

In order to avoid the fragmentation of the display image caused by tiling, it is necessary to reduce the frame size of a single small-sized display device and reduce the width of the tiling seam. The small-sized display device includes a display panel (e.g., a Mini LED display panel or a Micro LED display panel), and wires of the display panel can, for example, be connected to a circuit board (e.g., a flexible printed circuit) disposed on a non-surface of the display panel by connection leads, so that when the plurality of small-sized display devices are tiled to form the larger large-sized display device, a distance between adjacent small-sized display devices can be smaller. Therefore, display quality of the large-sized display device formed by tiling the plurality of small-sized display devices is improved.

At present, transparent glass or organic glass is commonly used as the substrate for the display panel, and the display panel is, for example, called a chip on glass (COG) display panel. However, the anti-static ability of the glass substrate is poor, and in the actual production process, especially tearing off protective films and other structures that play a protective role in the intermediate production process, as well as in the process of making the glass substrate, static electricity is easy generated, which will cause static electricity to break down conductive patterns and further cause certain damage to the display panel, affecting the quality of the product.

Based on this, some embodiments of the present disclosure provide a display panel. Coating and patterning processes are performed on only one surface of the display panel, that is, there is no need to turn over the display panel in the manufacturing process, which saves manufacturing time. In addition, by arranging an electrostatic induction structure in the display panel, electrostatic discharge can be induced, which effectively solves the problem of electrostatic breakdown, thereby improving the anti-static ability of the display panel, and further improving the yield and quality of display products.

Figure 2A:
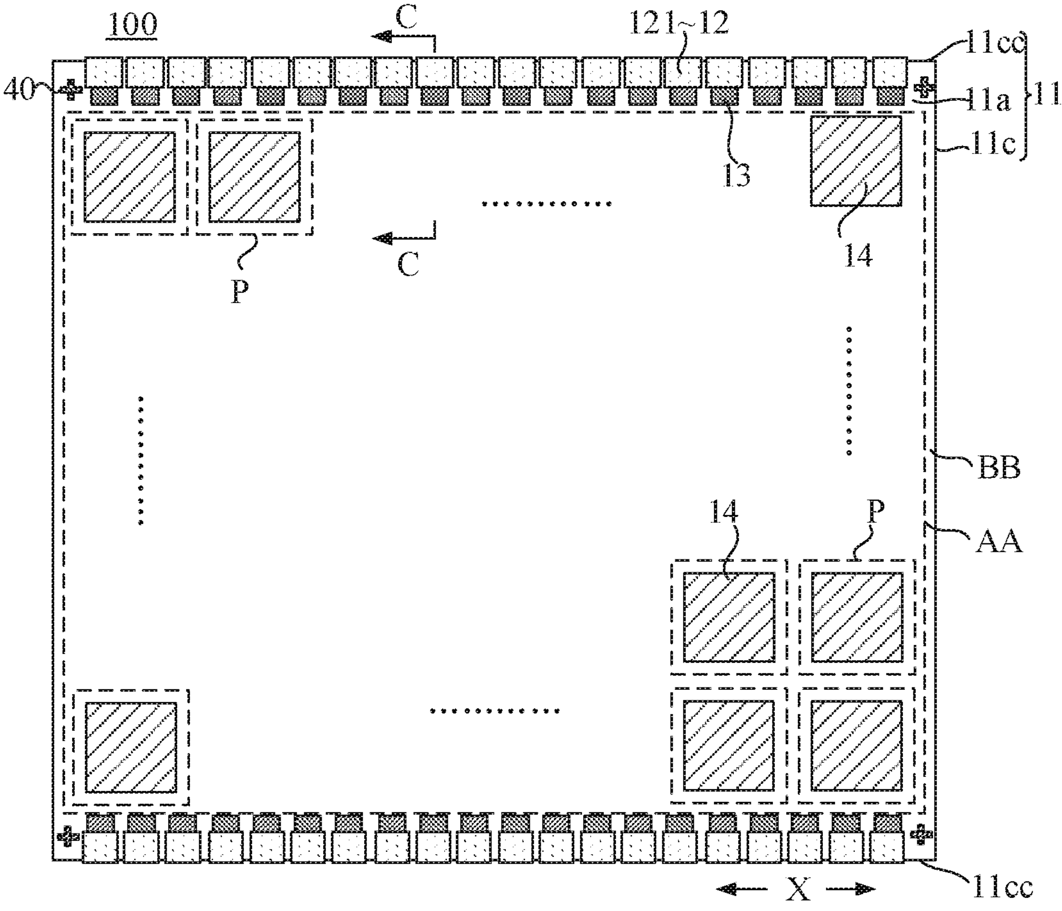
FIG. 2A is a plan view showing a structure of a display surface of a display panel, in accordance with some embodiments.
Figure 2B:
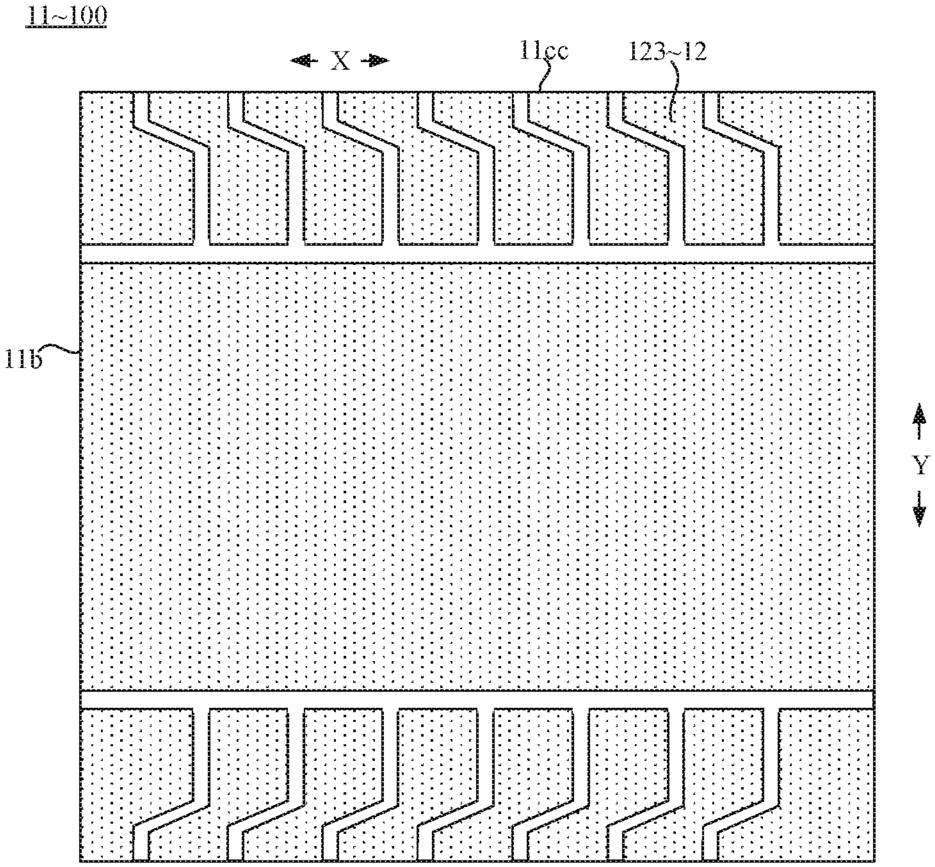
FIG. 2B is a plan view showing a structure of a non-display surface of a display panel, in accordance with some embodiments.
Figure 2C:
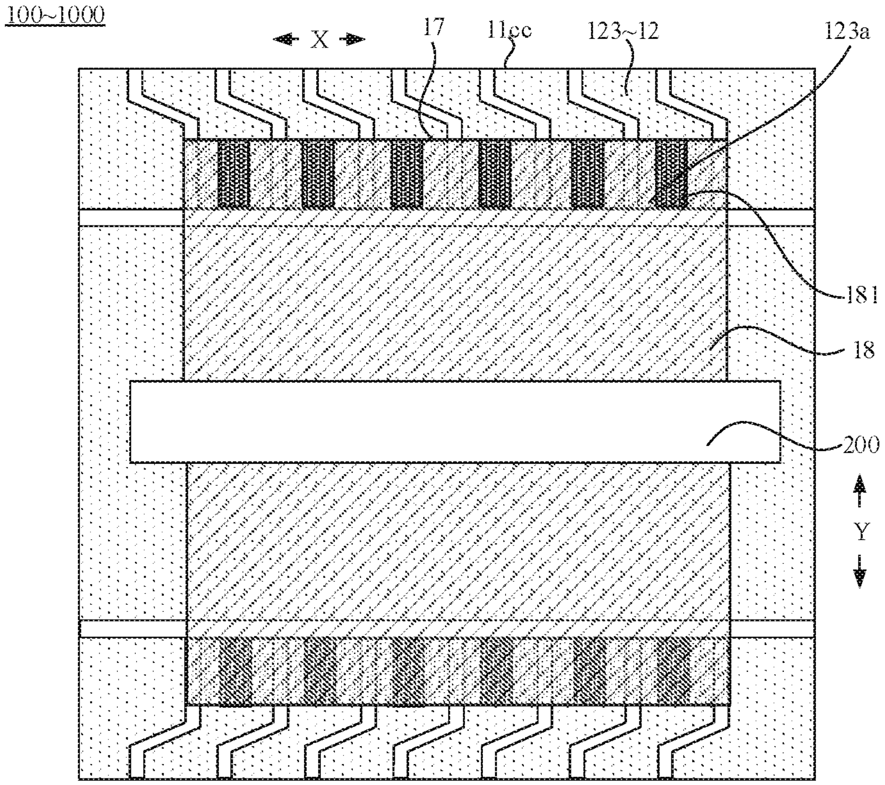
FIG. 2C is a plan view showing a structure of a non-display surface of a display device, in accordance with some embodiments.
Figure 2D:
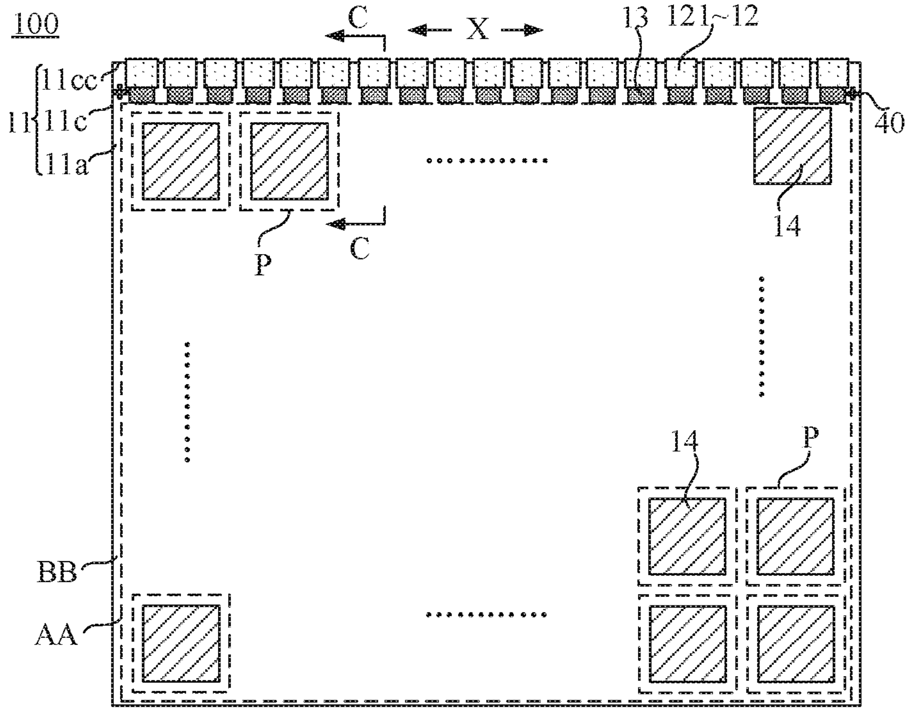
FIG. 2D is a plan view showing a structure of a display surface of another display panel, in accordance with some embodiments.

In some embodiments of the present disclosure, FIGS. 2A, 2B and 2D are planar structural views of the display panel 100, and FIG. 1 is a sectional structural view of the display panel 100 shown in FIG. 2A (or FIG. 2D) taken along the section line CC.

As shown in FIGS. 2A and 2D, some embodiments of the present disclosure provide the display panel 100, and the display panel 100 includes a display area AA and a peripheral area BB disposed on at least one side of the display area AA. For example, the peripheral area BB may be located on one side, two sides or three sides of the display area AA, or the peripheral area BB may be arranged around the display area AA.

In some embodiments, as shown in FIGS. 1 and 2A (or FIG. 2D), the display panel 100 includes a substrate 11 and a plurality of connection wires 12. The substrate 11 includes a first surface 11*a* and a second surface 11*b* that are opposite, and a plurality of side surfaces 11*c* connecting the first surface 11*a* and the second surface 11*b*, and at least one side surface 11*c* in the plurality of side surfaces 11*c* of the substrate 11 is a selected side surface 11*cc*. As shown in FIGS. 2A and 2D, the substrate 11 includes four side surfaces 11*c*. The two opposite side surfaces 11*c* in FIG. 2A are selected side surfaces 11*cc*, and there is one selected side surface 11*cc* in FIG. 2D. The plurality of connection wires 12 are arranged side by side at intervals, and each connection wire 12 in the plurality of connection wires 12 includes a first-segment wire 121, a second-segment wire 122 and a third-segment wire 123 connected in sequence. The first-segment wire 121 is located on the first surface 11*a* of the substrate 11, the second-segment wire 122 is located on the selected side surface 11*cc*, and the third-segment wire 123 is located on the second surface 11*b* of the substrate 11.

The first surface 11*a* of the substrate is the front of the display panel 100, i.e., the display surface of the display panel 100. The second surface 11*b* of the substrate is the back of the display panel 100. Both the first-segment wire 121 and the third-segment wire 123 of the connection wire 12 extend in a direction perpendicular to the selected side surface 11*cc* of the substrate 11, e.g., the second direction Y shown in FIG. 1. For example, a dimension D1 of the third-segment wire 123 in the second direction Y is greater than a dimension D2 of the first-segment wire 121 in the second direction Y. For example, the first-segment wire 121 is located on the peripheral area BB of the first surface 11*a*, and an orthographic projection of the third-segment wire 123 on the first surface 11*a* of the substrate 11 extends to the display area AA. A plurality of third-segment wires 123 of the plurality of connection wires 12 are used to be bonded to the flexible printed circuit (FPC), and ends of the plurality of third-segment wires 123 away from the selected side surface 11*cc* are in contact with the FPC.

It should be noted that, the display panel 100 includes a display surface (the first surface) and a non-display surface (the second surface); referring to FIGS. 2A and 2B, FIG. 2A is a structural diagram of the display surface of the display panel 100, and FIG. 2B is a structural diagram of the non-display surface of the display panel 100. There are two sets of third-segment wires 123 shown in FIG. 2B, which are arranged on sides proximate to the two selected side surface 11*cc* respectively, and third-segment wires 123 in each set are all used to be bonded to the FPC.

For example, the first surface 11*a* and the second surface 11*b* of the substrate 11 are, for example, in a shape of a rectangle, and the material of the substrate 11 is, for example, glass, quartz, or other insulating material.

In some embodiments, as shown in FIGS. 1 to 2D, the display panel 100 further includes a plurality of first electrodes 13 and a plurality of light-emitting devices 14, and the plurality of first electrodes 13 and the plurality of light-emitting devices 14 are disposed on the first surface 11*a* of the substrate 11. The plurality of first electrodes 13 are arranged in the first direction X, and the plurality of first electrodes 13 are closer to the selected side surface 11*cc* relative to the plurality of light-emitting devices 14. It should be noted that the plurality of first electrodes 13 and the plurality of light-emitting devices 14 may not be in contact with the first surface 11*a* of the substrate 11. For example, an insulating layer is disposed between the plurality of first electrodes 13 and the first surface 11*a* of the substrate 11; a film structure such as a driving circuit layer is disposed between the plurality of light-emitting devices 14 and the first surface 11*a* of the substrate 11, and the driving circuit layer includes signal wires. The plurality of first electrodes 13 are electrically connected to the light-emitting devices 14 through the signal wires of the driving circuit layer, and the signal wires are configured to transmit signals to the light-emitting devices 14, so as to drive the light-emitting devices 14 to emit light; each of the plurality of first electrodes 13 is electrically connected to (for example, in contact with) the first-segment wire 121 of one connection wire 12.

For example, as shown in FIGS. 2A and 2D, the display panel 100 includes sub-pixels P of at least three colors, and the sub-pixels of multiple colors include at least sub-pixels of a first color, sub-pixels of a second color and sub-pixels of a third color. The first color, the second color and the third color are three primary colors (e.g., red, green and blue). For example, each sub-pixel P includes at least one light-emitting device 14.

For example, the light-emitting device 14 includes, but not limited to, an organic light-emitting diode (OLED), Mini LED, Micro LED, or the like.

In some examples, as shown in FIG. 2A, Mini LEDs or Micro LEDs are used as the light-emitting devices 14. Compared with a traditional LED, the Mini LED or Micro LED occupies smaller volume and its size is smaller, and within the same screen size, the density of light sources within a unit area is higher and the unit size of the light source is smaller. Therefore, precise local control of the light-emitting devices 14 can be achieved, the problem of uneven brightness of the light-emitting devices 14 will not occur, and the uniformity of the display brightness can be ensured, thereby ensuring that the display quality of the display panel 100.

Figure 3A:
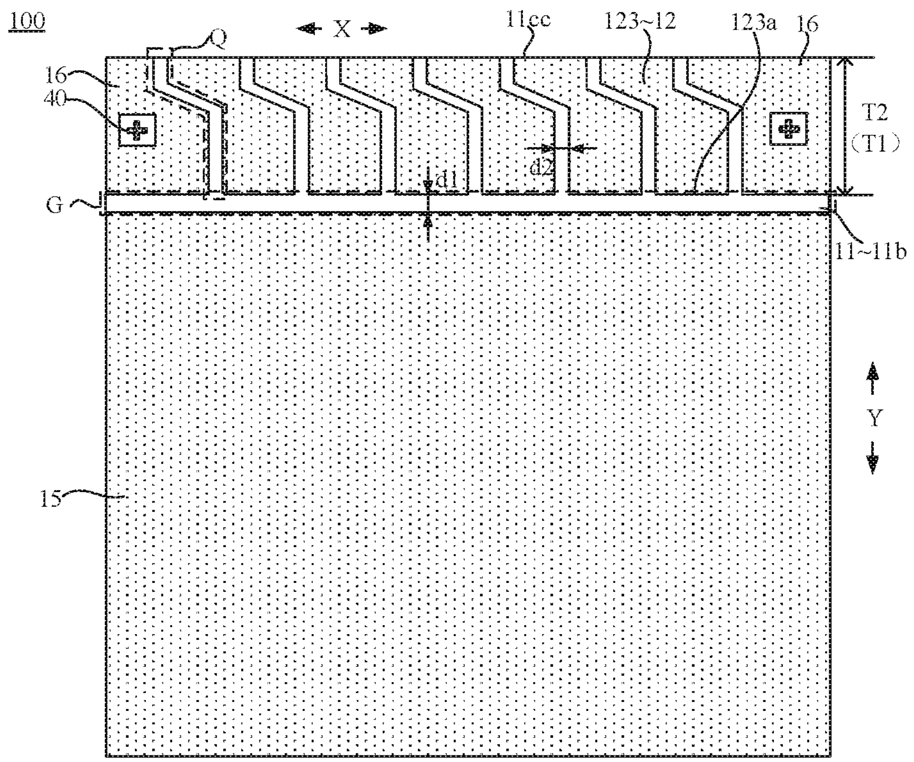
FIG. 3A is a structural diagram of a second surface of a display panel, in accordance with some embodiments.
Figure 3B:
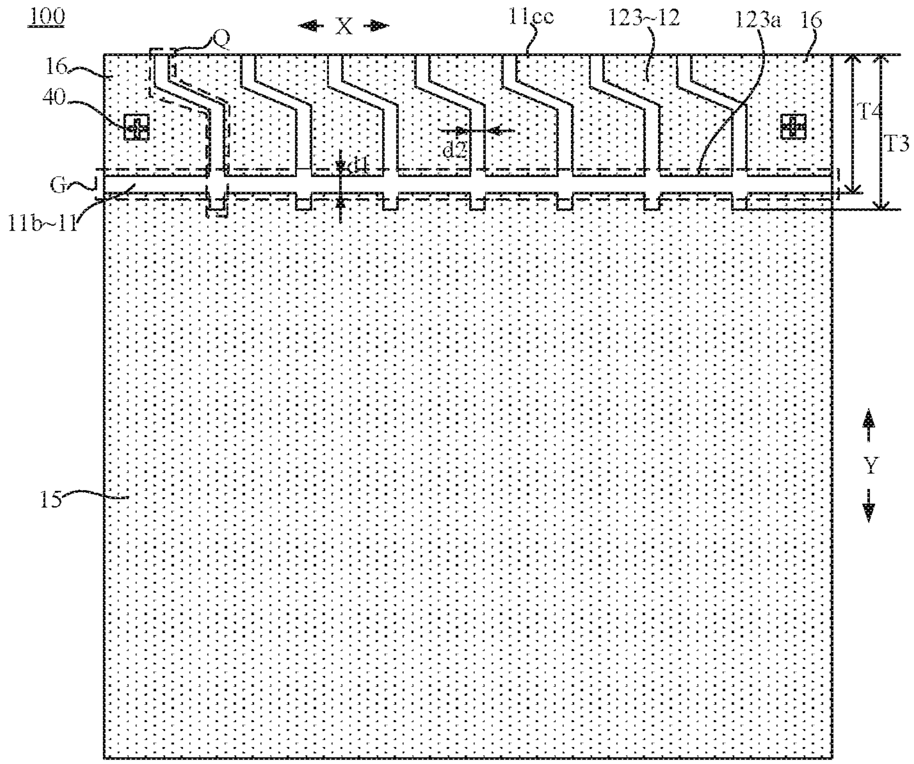
FIG. 3B is a structural diagram of a second surface of a display panel, in accordance with some embodiments.
Figure 4:
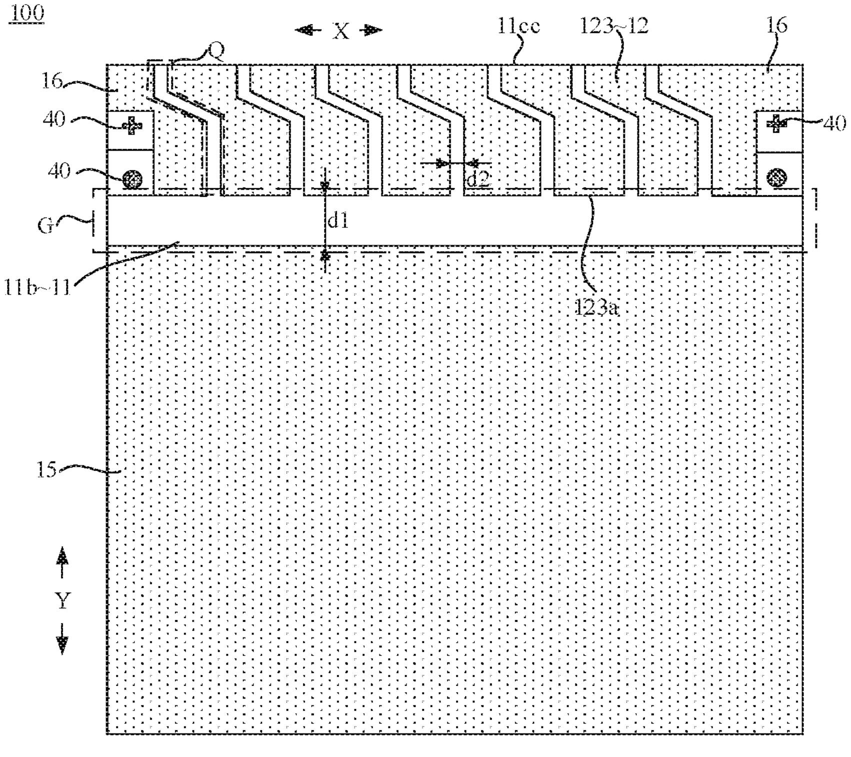
FIG. 4 is a structural diagram of a second surface of a display panel, in accordance with some embodiments.

In some embodiments, referring to FIGS. 3A to 4, FIGS. 3A to 4 are structural diagrams of the second surface 11*b* of the substrate 11, the display panel 100 further includes a first electrostatic discharge structure 15 disposed on the second surface 11*b* of the substrate 11, and the first electrostatic discharge structure 15 is arranged on a side of the plurality of third-segment wires 123 away from the selected side surface 11*cc*. The second surface 11*b* of the substrate 11 includes an isolation region G located between the third-segment wires 123 of the plurality of connection wires 12 and the first electrostatic discharge structure 15, and the isolation region G is configured to separate the plurality of connection wires 12 from the first electrostatic discharge structure 15, so that the two are electrically isolated.

For example, the first electrostatic discharge structure 15 is a film layer laid on the second surface 11*b*, and the first electrostatic discharge structure 15 and the plurality of connection wires 12 are located in the same metal layer. The first electrostatic discharge structure 15 and the substrate 11 are in contact with each other. Therefore, when static electricity is generated during the fabrication of the display panel, there will be a certain potential difference between the substrate 11 and the first electrostatic discharge structure 15, the static charges on the substrate 11 will be transferred to the first electrostatic discharge structure 15, and thus the static electricity on the substrate 11 is conducted through electrostatic discharge. The first electrostatic discharge structure 15 is configured to discharge the static electricity on the surface of the substrate 11, thereby improving the anti-static ability of the substrate 11.

It should be noted that, the isolation region G is a region between the third-segment wires 123 of the plurality of connection wires 12 and the first electrostatic discharge structure 15 on the second surface 11*b*, there is no metal coating layer in the isolation region G, and the second surface 11*b* is exposed in the isolation region G.

During the fabrication process of the display panel 100, static electricity is easily generated, which affects the fabrication process and the quality of the final display panel 100. The first electrostatic discharge structure 15 is disposed on the second surface 11*b* of the substrate 11, so that the static electricity can be discharged by the first electrostatic discharge structure 15, thereby improving the anti-static ability of the substrate 11 and avoiding damage to the product caused by electrostatic breakdown during the fabrication process. In addition, the arrangement of the isolation region G can ensure that the plurality of third-segment wires 123 located on the second surface 11*b* are separated from the first electrostatic discharge structure 15, so that there is no electrical relationship between the two. In this way, it avoids connection between the plurality of third-segment wires 123 through the first electrostatic discharge structure 15, which affects signal transmission. Moreover, ends of the plurality of third-segment wires 123 away from the selected side surface 11*cc* are bonding ends 123*a*, and the bonding ends 123*a* are configured to be bonded to the FPC; and in the case where the bonding ends 123*a* of the plurality of third-segment wires 123 are bonded to the FPC, by arranging the isolation region G, it is also possible to avoid connection due to contact between bonding terminals of the FPC and the first electrostatic discharge structure 15, thereby avoiding short circuits or other adverse phenomena.

For example, with continued reference to FIGS. 3A to 4, the plurality of connection wires 12 are formed by dividing a continuous metal coating layer through an etching process; there is a spacing region Q between adjacent third-segment wires 123, and the metal coating layer in the spacing region Q is removed by a laser etching process, so as to separate the adjacent third-segment wires 123. Further, any two adjacent spacing regions Q have one third-segment wire 123 therebetween (that is, the plurality of third-segment wires 123 are arranged at intervals in the first direction X), and there is the spacing region Q between the third-segment wire 123 closest to a side surface of the substrate 11 perpendicular to the selected side surface 11*cc* and the side surface of the substrate 11 perpendicular to the selected side surface 11*cc*, so that any third-segment wire 123 is separated from other electrical patterns (including other third-segment wires 123) around it.

In some examples, referring to FIG. 3A, a dimension T1 of the spacing region Q in the second direction Y is equal to a distance T2 between the side of the isolation region G proximate to the selected side surface 11*cc* and the selected side surface 11*cc*.

For example, referring to FIG. 3A, the fabrication processes of the plurality of connection wires 12 and the first electrostatic discharge structure 15 are, for example, forming the metal coating layer on the second surface 11*b*, the selected side surface 11*cc* and part of the first surface 11*a* of the substrate 11 by sputtering, and removing part of the metal coating layer located in the spacing regions Q and the isolation region G by laser etching. In the process of laser etching, along the second direction Y, ends of the spacing regions Q away from the selected side surface 11*cc* communicate with the isolation region G as a whole, and the ends of the spacing regions Q away from the selected side surface 11*cc* do not overlap with the isolation region G. It can be seen that the dimension T1 of the spacing region Q in the second direction Y is equal to the distance T2 between the side of the isolation region G proximate to the selected side surface 11*cc* and the selected side surface 11*cc*.

In some examples, referring to FIG. 3B, a dimension T3 of the spacing region Q in the second direction Y is greater than a distance T4 between a side of the isolation region G away from the selected side surface 11*cc* and the selected side surface 11*cc*.

For example, referring to FIG. 3B, the fabrication processes of the plurality of connection wires 12 and the first electrostatic discharge structure 15 are, for example, forming the metal coating layer on the second surface 11*b*, the selected side surface 11*cc* and part of the first surface 11*a* of the substrate 11 by sputtering, and removing part of the metal coating layer located in the spacing regions Q and the isolation region G by laser etching. In the process of laser etching, along the second direction Y, ends of the spacing regions Q away from the selected side surface 11*cc* extend beyond the isolation region G; in other words, the isolation region G crosses ends of the spacing regions Q away from the selected side surface 11*cc*. Thus, the dimension T3 of the spacing region Q in the second direction Y is greater than the distance T4 between the side of the isolation region G away from the selected side surface 11*cc* and the selected side surface 11*cc*, that is, a portion of the spacing region Q away from the selected side surface 11*cc* overlaps with the isolation region G. In the process of bonding the third-segment wires 123 of the plurality of connection wires 12 to the FPC, the spacing region Q between the third-segment wires 123 of two adjacent connection wires 12 does not affect the electrical relationship between the plurality of third-segment wires 123 and the first electrostatic discharge structure 15 relative to the portion of the isolation region G away from the selected side surface 11*cc*, which can ensure the electrical isolation between the third-segment wires 123 of the plurality of connection wires 12 and the first electrostatic discharge structure 15, and thus avoid the connection between the plurality of third-segment wires 123 through the first electrostatic discharge structure 15, and avoid affecting signal transmission.

In some embodiments, referring to FIGS. 3A and 3B, a dimension d1 of the isolation region G in the second direction Y is equal to a distance d2 between two adjacent third-segment wires 123. The second direction Y is perpendicular to the first direction X. It can be known from the above that the plurality of connection wires 12 are formed by the laser etching process, and the isolation region G is also formed by the laser etching process. Here, d1 and d2 are set to be equal, which is convenient for processing and can improve the production efficiency of products.

In some embodiments, the dimension d1 of the isolation region G in the second direction Y is in a range of 10 μm to 2 mm.

For example, referring to FIGS. 3A and 3B, the dimension d1 of the isolation region G in the second direction Y may be 10 μm, 50 μm, 100 μm, 1 mm or 2 mm. By setting the range of the dimension d1 of the isolation region G in the second direction Y, the production efficiency can be improved, and the damage caused by the laser etching can be avoided.

In some embodiments, referring to FIG. 4, the dimension d1 of the isolation region G in the second direction Y is greater than the distance d2 between two adjacent third-segment wires 123. The second direction Y is is perpendicular to the first direction X.

For example, as shown in FIG. 4, the fabrication process of the isolation region G shown in FIG. 4 is different from that of the isolation region G shown in FIGS. 3A and 3B. It can be seen from the above introduction that the isolation region G shown in FIGS. 3A and 3B is fabricated by the etching process, while the isolation region G shown in FIG. 4 is fabricated by a masking process. Considering the limitation of the masking material, in the process of fabricating the isolation region G, the masking material needs to be attached to a location corresponding to the isolation region G; if the dimension d1 of the isolation region G in the second direction Y is too narrow, the requirements for the dimensional accuracy of the masking material and the alignment accuracy of masking are very high, and it is difficult to fabricate an accurate isolation region G. Therefore, in the case where the isolation region G is fabricated by using the masking process, the dimension d1 of the isolation region G in the second direction Y needs to be designed to be greater than the distance d2 between two adjacent third-segment wires 123.

In some embodiments, the dimension d1 of the isolation region G in the second direction Y is in a range of 300 μm to 2 mm.

For example, referring to FIG. 4, the dimension d1 of the isolation region G in the second direction Y may be 300 μm, 500 μm, 1 mm, 1.5 mm or 2 mm. By setting the dimension d1 of the isolation region G in the second direction Y, accurate masking can be achieved in the masking process for forming the isolation region G, and the production efficiency can be improved. In addition, the plurality of third-segment wires 123 can be better electrically isolated from the first electrostatic discharge structure 15, which can avoid the connection between the plurality of third-segment wires 123 through the first electrostatic discharge structure 15, and avoid affecting signal transmission.

In some embodiments, a thickness of the first electrostatic discharge structure 15 is approximately equal to a thickness of the third-segment wire 123.

It can be known from the above that the first electrostatic discharge structure 15 and the plurality of third-segment wires 123 are obtained from the same metal coating layer, so that the two have the approximately equal thickness. It should be noted that the approximately equal thickness here means that the difference between the thickness of the first electrostatic discharge structure 15 and the thickness of the third-segment wire 123 is within a certain range, and the thickness difference between the two is not large. For example, a ratio of the thickness difference between the two to the thickness of one of the two is less than 10%, or may also be less than 5%.

In some embodiments, referring to FIGS. 5A, 5B, 6A, 6B, 7A and 7B, the third-segment wires 123 of the plurality of connection wires 12 are arranged in the first direction X, and the isolation region G extends in the first direction X; the ends of the third-segment wires 123 away from the selected side surface 11*cc* are the bonding ends 123*a*, and a dimension of the isolation region G in the first direction X is greater than or equal to a distance between a side of the first bonding end 123*a*1 away from the second bonding end 123*a*2 and a side of the second bonding end 123*a*2 away from the first bonding end 123*a*1 in the first direction X. The first bonding end 123*a*1 and the second bonding end 123*a*2 are bonding ends 123*a* of two third-segment wires 123 that are farthest apart, respectively. In other words, sides, away from each other, of the bonding ends 123*a* (i.e., the first bonding end 123*a*1 and the second bonding end 123*a*2) of two third-segment wires 123 that are closest to two side surfaces 11*c* of the substrate 11 adjacent to the selected side surface 11*cc* in the plurality of third-segment wires 123 have a distance Lin the first direction X.

In some examples, the third-segment wire 123 is a straight segment extending in the second direction Y. Alternatively, as shown in FIGS. 5A, 5B, 6A, 6B, 7A and 7B, the third-segment wire 123 is a broken line segment extending in the second direction Y as a whole. The end of the third-segment wire 123 away from the selected side surface 11*cc* is the bonding end 123*a*, and the bonding end 123*a* is configured to be bonded to the FPC. The bonding end 123*a* of the third-segment wire is closer to the isolation region G. Therefore, in order to ensure that the isolation region G electrically isolates the plurality of third-segment wires 123 from the first electrostatic discharge structure 15, there is a need to define the relationship between the dimension of the isolation region G and the distance between the sides, away from each other, of the first bonding end 123*a*1 and the second bonding end 123*a*2 in the first direction X.

Figure 5A:
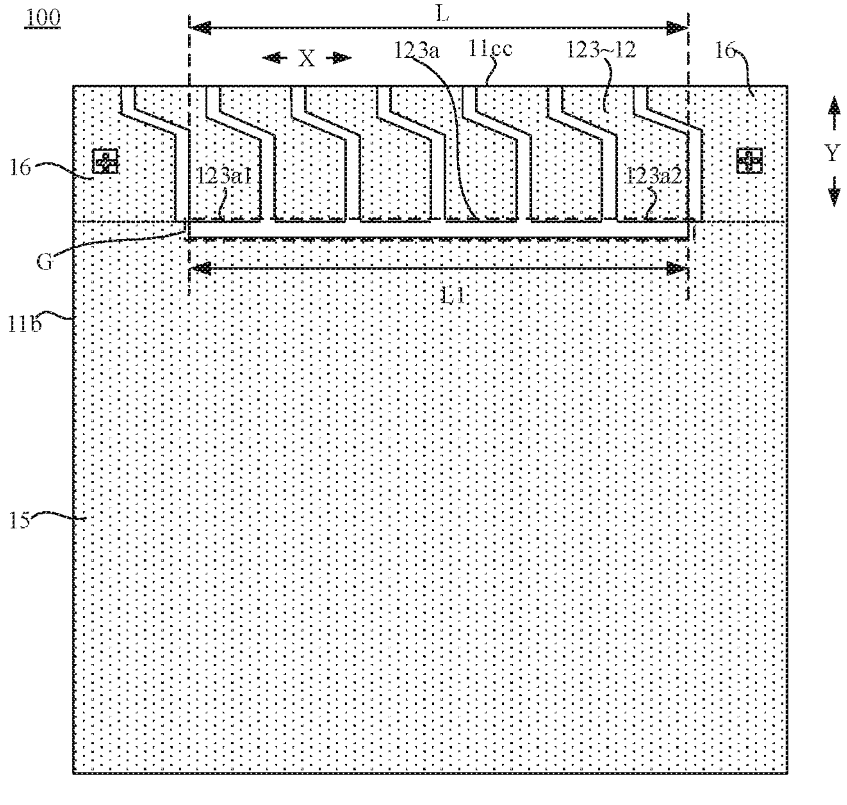
FIG. 5A is a structural diagram of a second surface of a display panel, in accordance with some embodiments.
Figure 5B:
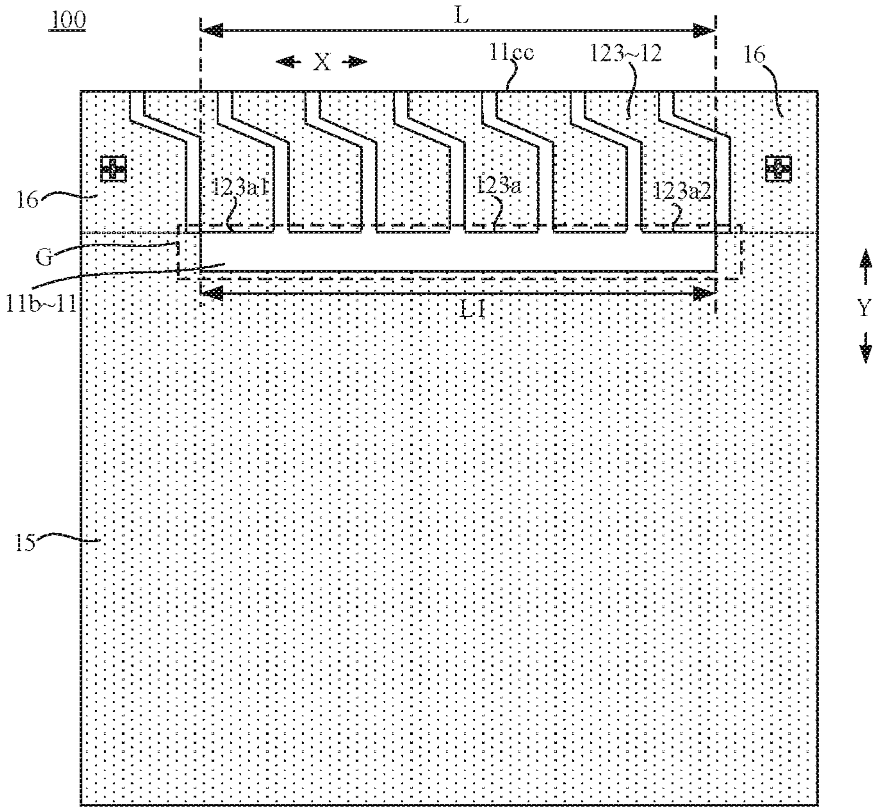
FIG. 5B is a structural diagram of a second surface of a display panel, in accordance with some embodiments.

For example, as shown in FIGS. 5A and 5B, the dimension of the isolation region G in the first direction X is L1, the distance between the sides, away from each other, of the first bonding end 123*a*1 and the second bonding end 123*a*2 in the first direction X is L, and L1 is equal to L (i.e., L1=L). That is, the distance between two borders of the isolation region G in the first direction X is the same as the distance between two borders, close to two sides of the second surface 11*b* of the substrate 11, of the bonding ends 123*a* of the two third-segment wires 123 in the first direction X. The isolation region G can electrically isolate the plurality of third-segment wires 123 from the first electrostatic discharge structure 15, which can avoid connection between the plurality of third-segment wires 123 through the first electrostatic discharge structure 15 and avoid affecting signal transmission. In addition, in the case where the plurality of third-segment wires 123 are bonded to the FPC, by arranging the isolation region G, it is also possible to avoid connection due to contact between bonding terminals of the FPC and the first electrostatic discharge structure 15, thereby avoiding short circuits or other adverse phenomena.

Figure 6A:
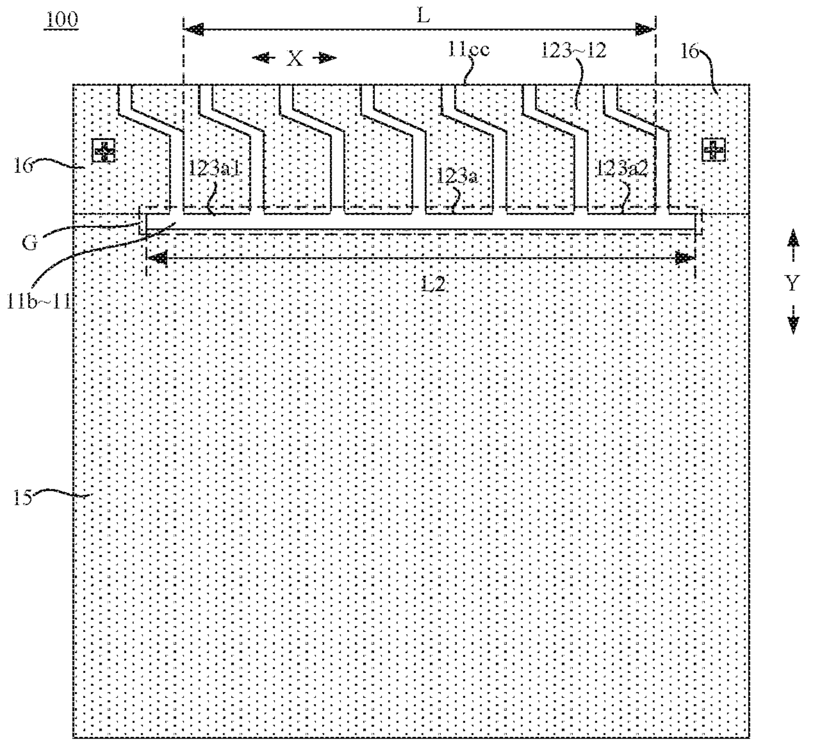
FIG. 6A is a structural diagram of a second surface of a display panel, in accordance with some embodiments.
Figure 6B:
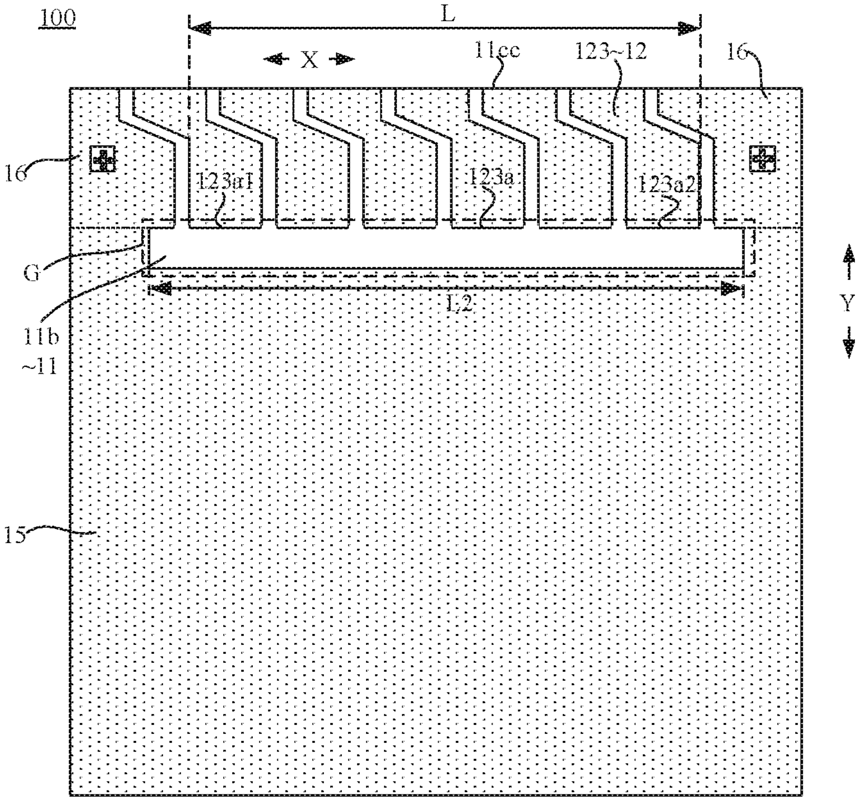
FIG. 6B is a structural diagram of a second surface of a display panel, in accordance with some embodiments.

For example, as shown in FIGS. 6A and 6B, the dimension of the isolation region G in the first direction X is L2, the distance between the sides, away from each other, of the first bonding end 123*a*1 and the second bonding end 123*a*2 in the first direction X is L, and L2 is greater than L (i.e., L2>L). That is, the distance between two borders of the isolation region G in the first direction X is greater than the distance between two borders, close to two sides of the second surface 11*b* of the substrate 11, of the bonding ends 123*a* of the two third-segment wires 123 in the first direction X. The effects that the display panel 100 can achieve are similar to those of the display panel 100 shown in FIGS. 5A and 5B, and will not be repeated here.

Figure 7A:
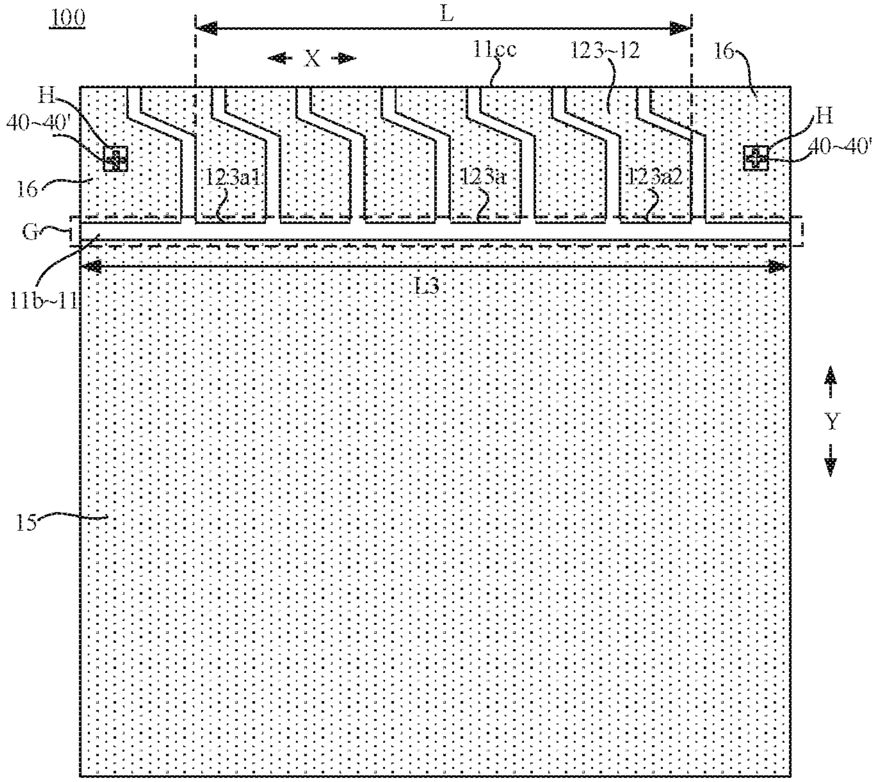
FIG. 7A is a structural diagram of a second surface of a display panel, in accordance with some embodiments.
Figure 7B:
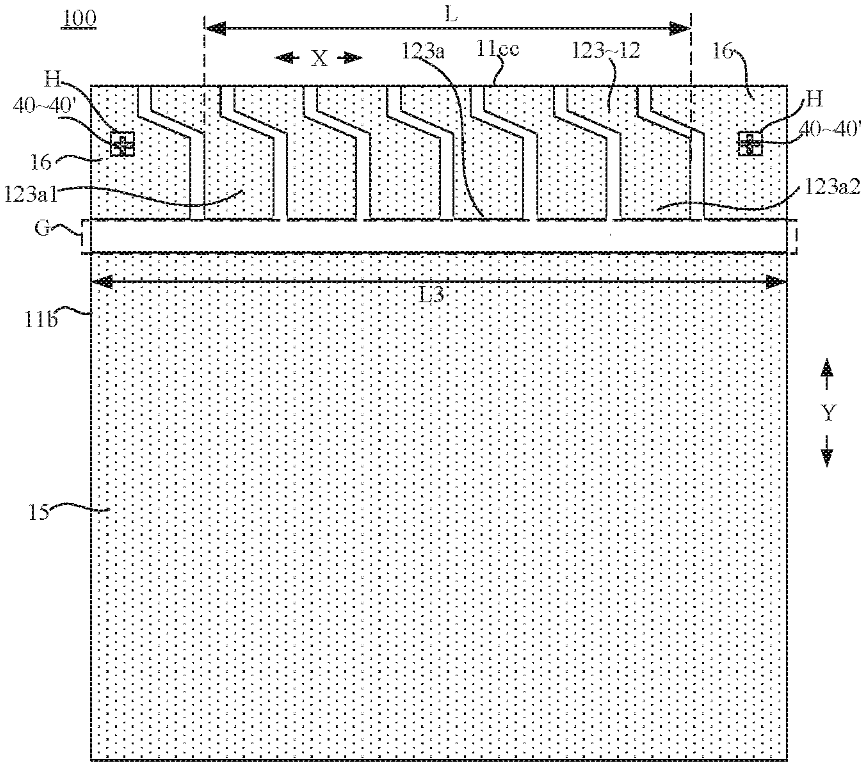
FIG. 7B is a structural diagram of a second surface of a display panel, in accordance with some embodiments.

For example, referring to FIGS. 7A and 7B, the dimension of the isolation region G in the first direction X is L3, which is equal to the dimension of the second surface 11*b* in the first direction X. That is, the isolation region G can divide the second surface 11*b* into two portions, the first electrostatic discharge structure 15 is disposed on a portion of the second surface 11*b* on a side of the isolation region G away from the selected side surface 11*cc*, and the plurality of third-segment wires 123 are disposed on the other portion of the second surface 11*b* on a side of the isolation region G proximate to the selected side surface 11*cc*. The effects that the display panel 100 can achieve are similar to those of the display panel 100 shown in FIGS. 5A and 5B, which will not be repeated here.

In some embodiments, as shown in FIGS. 5A, 5B, 6A, 6B, 7A and 7B, the display panel 100 further includes second electrostatic discharge structures 16 disposed on the second surface 11*b*, the number of the second electrostatic discharge structures 16 is two, and the two second electrostatic discharge structures 16 are located on both sides of the plurality of third-segment wires 123 in the first direction X and are electrically isolated from the third-segment wires 123. In the first direction X and the second direction Y, the borders of the two second electrostatic discharge structures 16 away from the third-segment wires 123 coincide with the borders of the second surface 11*b*, and the two second electrostatic discharge structures 16 are electrically isolated from the third-segment wires 123, which may avoid connection between the third-segment wires 123 through the second electrostatic discharge structures 16 and avoid affecting signal transmission.

For example, the fabrication method of the second electrostatic discharge structures 16 is, for example, forming a metal coating layer on the second surface of the substrate, removing a portion of the metal coating layer in the spacing region and the isolation region by etching. The remaining metal coating layer forms the first electrostatic discharge structure 15, the plurality of third-segment wires 123 and the second electrostatic discharge structures 16.

In some embodiments, referring to FIGS. 5A to 6B, the dimension of the isolation region G in the first direction X is greater than or equal to the dimension of the bonding ends 123*a* of the plurality of third-segment wires 123 in the first direction X, and is less than the dimension of the second surface in the first direction. The second electrostatic discharge structure 16 is connected to the first electrostatic discharge structure 15.

For example, referring to FIGS. 5A and 5B, in FIGS. 5A and 5B, the isolation region G extends along the first direction X, and the dimension of the isolation region G in the first direction X is L1; the dimension of the bonding ends 123*a* of the plurality of third-segment wires 123 in the first direction X is L, and L1 is equal to L (i.e., L1=L). At this time, the second electrostatic discharge structures 16 and the first electrostatic discharge structure 15 communicate with each other and form a one-piece structure, and the second electrostatic discharge structures 16 and the first electrostatic discharge structure 15 are electrically isolated from the third-segment wires 123, which is equivalent to increasing the area of the electrostatic discharge structure. Thus, static electricity can be induced to be discharged by the first electrostatic discharge structure 15 and the second electrostatic discharge structures 16, thereby improving the anti-static ability of the substrate 11, and avoiding damage to the product caused by electrostatic breakdown during the fabrication process.

For example, referring to FIGS. 6A and 6B, in FIGS. 6A and 6B, the dimension of the isolation region G in the first direction X is L2, the dimension of the bonding ends 123*a* of the plurality of third-segment wires 123 in the first direction X is L, and L2 is greater than L (i.e., L2>L). At this time, the second electrostatic discharge structures 16 and the first electrostatic discharge structure 15 communicate with each other and form a one-piece structure, and the second electrostatic discharge structures 16 and the first electrostatic discharge structure 15 are electrically isolated from the third-segment wires 123. The effects that the display panel 100 can achieve are similar to those of the display panel 100 shown in FIGS. 5A and 5B, and will not be repeated here.

For example, referring to FIGS. 7A and 7B, in FIGS. 7A and 7B, the dimension of the isolation region G in the first direction X is L3, the dimension of the bonding ends 123*a* of the plurality of third-segment wires 123 in the first direction X is L, and L3 is greater than L (i.e., L3>L). At this time, the second electrostatic discharge structures 16 and the first electrostatic discharge structure 15 are separated by the isolation region G, and the second electrostatic discharge structures 16 and the first electrostatic discharge structure 15 are electrically isolated from the third-segment wires 123. The first electrostatic discharge structure 15 and the second electrostatic discharge structures 16 are configured to better discharge static electricity. Thus, the anti-static ability of the substrate 11 is improved, and the damage to the product caused by electrostatic breakdown during the fabrication process is avoided.

In some embodiments, the first electrostatic discharge structure 15, the second electrostatic discharge structure 16, and the third-segment wire 123 have a substantially equal thickness.

It should be noted that the substantially equal thickness means that the differences between the thickness of the first electrostatic discharge structure 15, the thickness of the second electrostatic discharge structure 16 and the thickness of the third-segment wire 123 are within a certain range, and the thickness difference is not large.

Figure 8A:
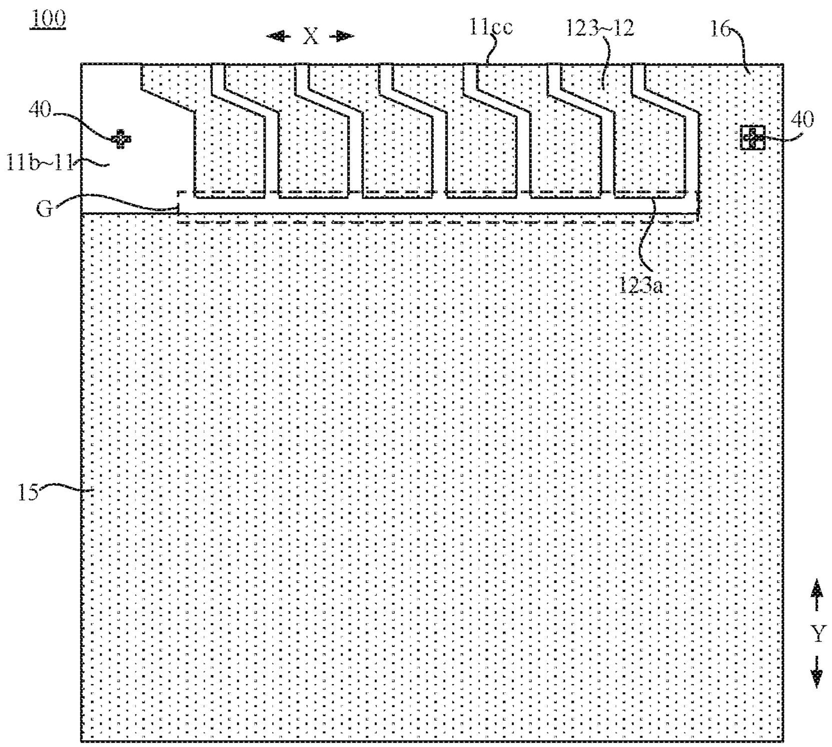
FIG. 8A is a structural diagram of a second surface of a display panel, in accordance with some embodiments.
Figure 8B:
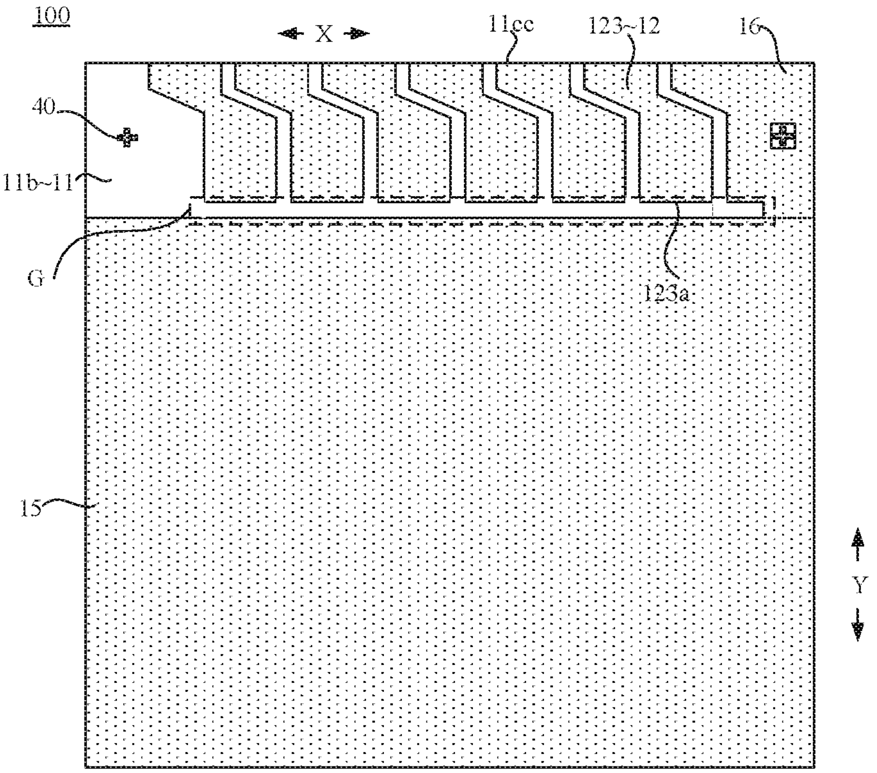
FIG. 8B is a structural diagram of a second surface of a display panel, in accordance with some embodiments.
Figure 8C:
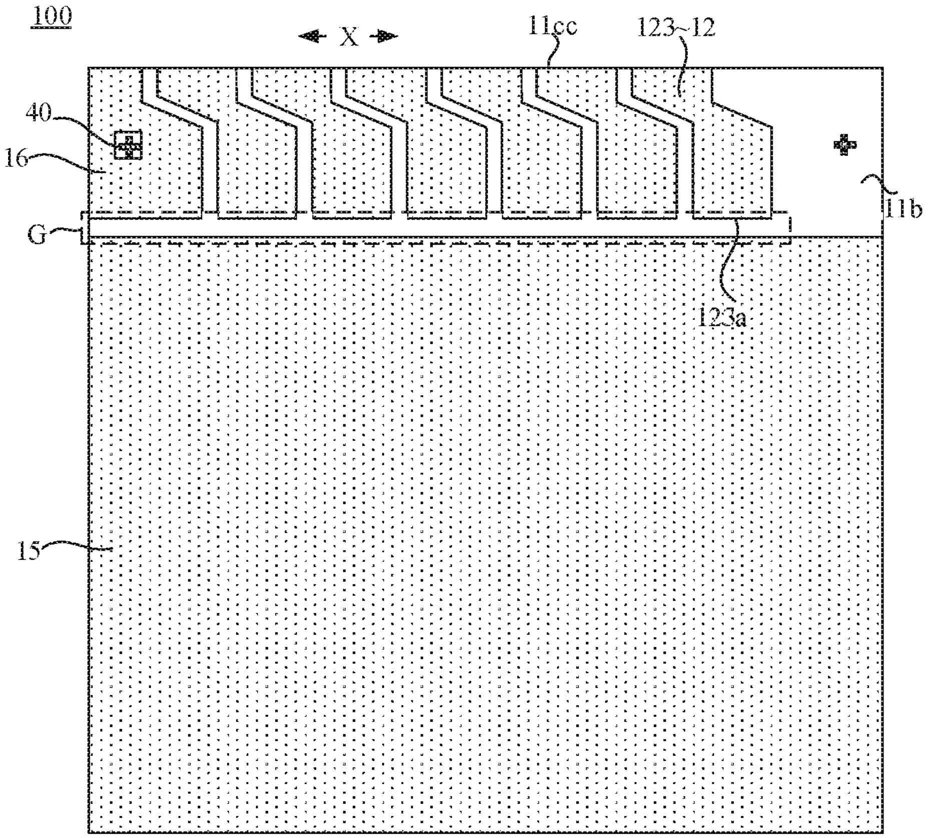
FIG. 8C is a structural diagram of a second surface of a display panel, in accordance with some embodiments.

In some embodiments, as shown in FIGS. 8A, 8B and 8C, the display panel 100 further includes a second electrostatic discharge structure 16 disposed on the second surface 11*b*, and there is one second electrostatic discharge structure 16. The second electrostatic discharge structure 16 is located on any side of the plurality of third-segment wires 123 in the first direction X. That is, in the first direction X, the second electrostatic discharge structure 16 may be disposed on a left side of the plurality of third-segment wires 123 or on a right side of the plurality of third-segment wires 123. Referring to FIGS. 8A and 8B, the second electrostatic discharge structure 16 is disposed on the right side of the plurality of third-segment wires 123. In addition, the second electrostatic discharge structure 16 is electrically isolated from the third-segment wires 123, which may avoid connection between the third-segment wires 123 through the second electrostatic discharge structure 16 and avoid affecting signal transmission.

For example, the second electrostatic discharge structure 16 is located on either side of the plurality of third-segment wires 123 in the first direction X, one side of the plurality of third-segment wires 123 is provided with the second electrostatic discharge structure 16 and the other side of the plurality of third-segment wires 123 is not provided with any structure. When the metal coating layer is etched, and the spacing region Q between two adjacent third-segment wires 123 in the plurality of third-segment wires 123 is etched, a portion of the metal coating layer at the location where no structure is provided is etched together.

In some embodiments, referring to FIGS. 7A, 7B, 9 and 10, and referring to the front structural view of the display panel shown in FIGS. 2A and 2D, the display panel 100 further includes at least one set of alignment marks 40' disposed on the first surface 11*a* of the substrate 11, and each set of alignment marks 40' includes two alignment marks 40. The plurality of first electrodes 13 are disposed on the first surface 11*a* of the substrate 11 and arranged in the first direction X, each first electrode 13 is electrically connected to a corresponding first-segment wire 121, and the two alignment marks 40 in each set of alignment marks 40' are located on both sides of the plurality of first electrodes 13 in the first direction X, respectively. The second surface 11*b* is provided with at least two mark exposure regions H, each of the at least two mark exposure regions H corresponds to an alignment mark 40 in position, and an orthographic projection of the alignment mark 40 on the second surface 11*b* is located within the mark exposure region H. The mark exposure region H exposes the second surface 11*b*.

For example, the alignment marks 40 in the set have the same shape and size, and alignment marks belonging to different sets may have different shapes and sizes. For example, the alignment mark 40 is a cross-shaped alignment mark or circular alignment mark. At least two alignment marks 40 are configured to achieve precise alignment when the FPC 18 is bonded.

It should be noted that the alignment marks 40 are disposed on the first surface 11*a* of the substrate 11. Since the material of the substrate 11 is glass or quartz material, and the substrate 11 is transparent, when the FPC located on the second surface 11*b* is bonded, the alignment marks 40 can be identified through the transparent material, thereby achieving precise alignment. That is, referring to FIGS. 7A, 7B, 9 and 10, the alignment marks 40 shown in the figures are all located on the first surface 11*a* of the substrate 11, the second surface 11*b* of the substrate 11 is exposed through the mark exposure regions H, and then the alignment marks 40 are exposed through the transparent substrate 11. Here, for the convenience of description, the alignment marks 40 are shown in the figures. It can be understood that, the alignment marks are located on the first surface of the substrate.

The fabrication method of the mark exposure regions can be obtained for example, by etching the metal coating layer, or by providing a mask in these regions, so that when the metal material is sputtered, the metal material will not be sputtered on the marked exposed regions. Therefore, the mark exposure regions can expose the second surface, so that the alignment marks can be exposed through the transparent substrate.

In some examples, referring to FIGS. 7A and 7B, the display panel includes one set of alignment marks 40', two alignment marks 40 in the set of alignment marks 40' are not in contact with the isolation region, and there is a certain distance between the alignment mark and the isolation region.

Figure 9:
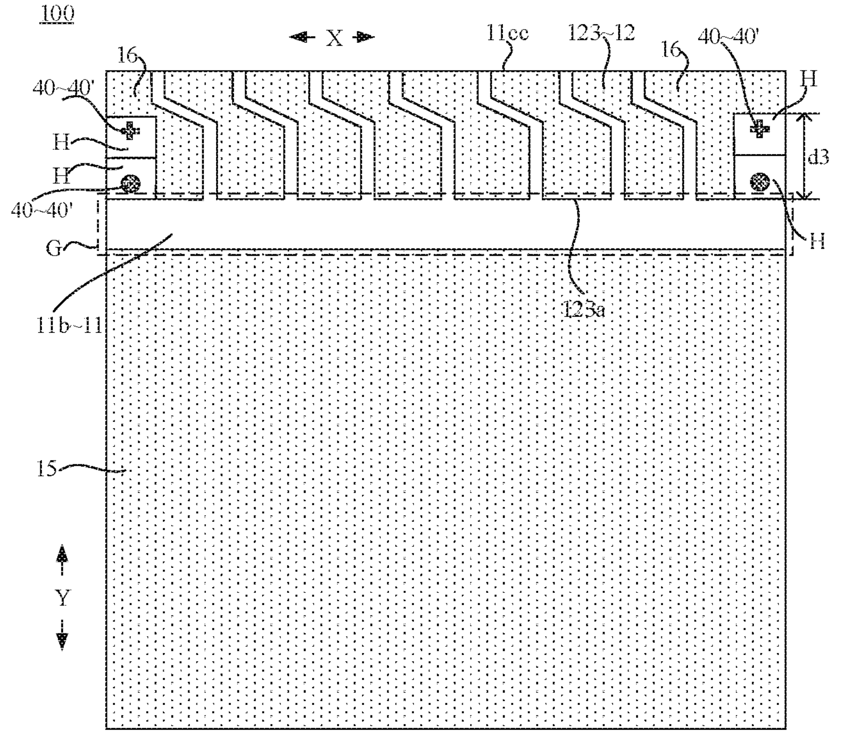
FIG. 9 is a structural diagram of a second surface of a display panel, in accordance with some embodiments.
Figure 10:
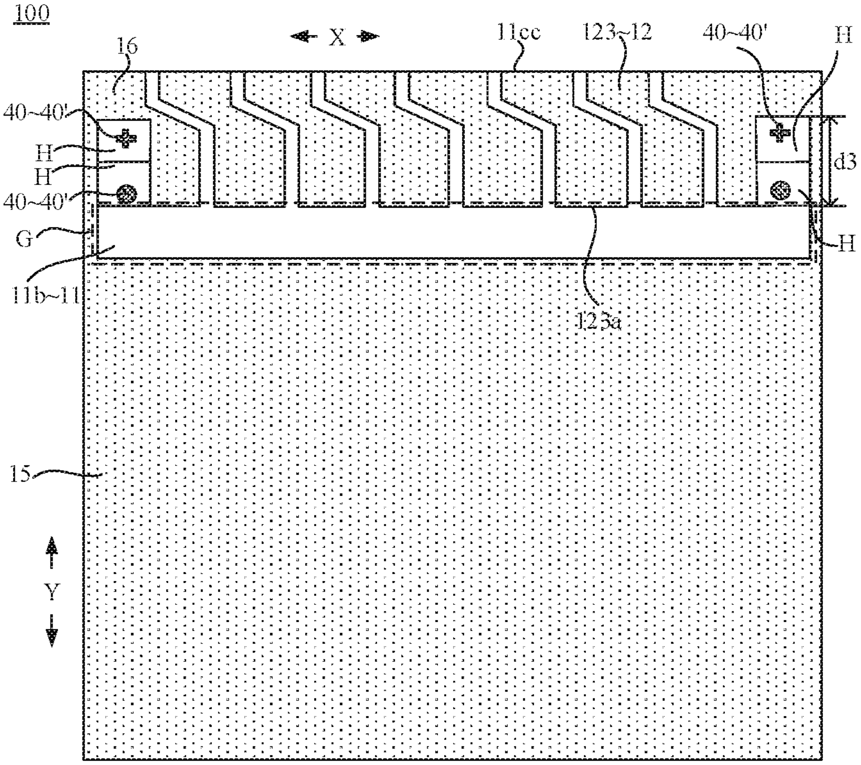
FIG. 10 is a structural diagram of a second surface of a display panel, in accordance with some embodiments.

In some other examples, referring to FIGS. 9 and 10, the display panel includes two sets of alignment marks, two cross-shaped alignment marks constitute a set, and two circular alignment marks constitute another set. The number of mark exposure regions H is, for example, four, and each mark exposure region H is located on the side of the isolation region G proximate to the selected side surface 11*cc*. The four mark exposure regions H are divided into two sets, which are respectively located on both sides of the plurality of third-segment wires 123 in the first direction X, two mark exposure regions H located on a side of the plurality of third-segment wires communicate with each other, and communicate with the isolation region G.

For example, referring to FIG. 9, the mark exposure regions H are located on the side of the isolation region G proximate to the selected side surface 11*cc*, and communicate with the isolation region G, and the mark exposure regions H and the isolation region G form a shape of Chinese character " "凹" " as a whole. The dimension of the isolation region G in the first direction X is equal to the dimension of the second surface 11*b* of the substrate 11 in the first direction X. For example, a portion of an edge of the isolation region G and a portion of an edge of the mark exposure region H are flush with an edge of the second surface 11*b*.

For example, referring to FIG. 10, two mark exposure regions H are located on the side of the isolation region G proximate to the selected side surface 11*cc*, and communicate with the isolation region G, and the mark exposure regions H and the isolation region G form a shape of Chinese character " "凹" " as a whole. The dimension of the isolation region G in the first direction X is less than the dimension of the second surface 11*b* of the substrate 11 in the first direction X. For example, a portion of an edge of the isolation region G is flush with a portion of an edge of the mark exposure region H and is parallel to an edge of the second surface 11*b*. In this case, there is a certain distance between the mark exposure region H and the edge of the second surface 11*b* in the first direction X, and the second electrostatic discharge structure and the first electrostatic discharge structure can communicate with each other to form a one-piece structure, which is further conducive to electrostatic discharge.

In some embodiments, referring to FIGS. 9 and 10, the dimension of the mark exposure region H in the second direction Y is in a range of 1.7 mm to 8 mm. For example, the dimension d3 of the mark exposure region H in the second direction Y may be 1.7 mm, 2 mm, 4 mm, 6 mm or 8 mm. The dimension d3 of the mark exposure region H in the second direction Y is less than the dimension of the plurality of third-segment wires 123 located on the second surface 11*b* in the second direction Y, which can increase the area of the second electrostatic discharge structure 16. Thus, the static electricity can be induced to be discharged by the first electrostatic discharge structure 15 and the second electrostatic discharge structure 16, thereby improving the anti-static ability of the substrate 11, and avoiding damage to the product caused by the electrostatic breakdown during the fabrication process.

Figure 11A:
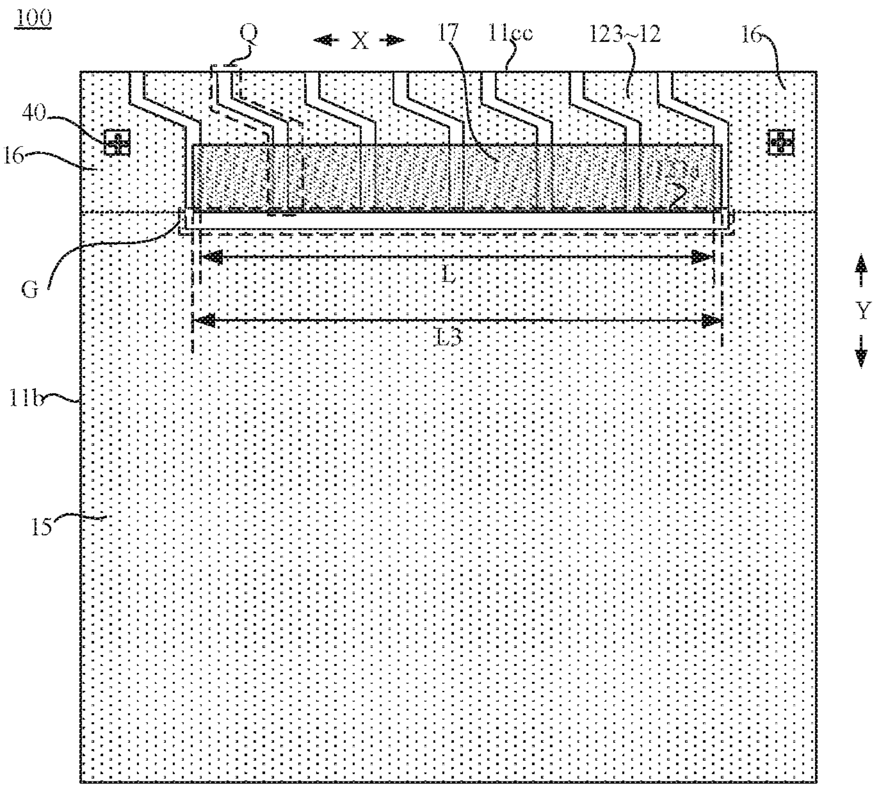
FIG. 11A is a structural diagram of a second surface of a display panel, in accordance with some embodiments.
Figure 11B:
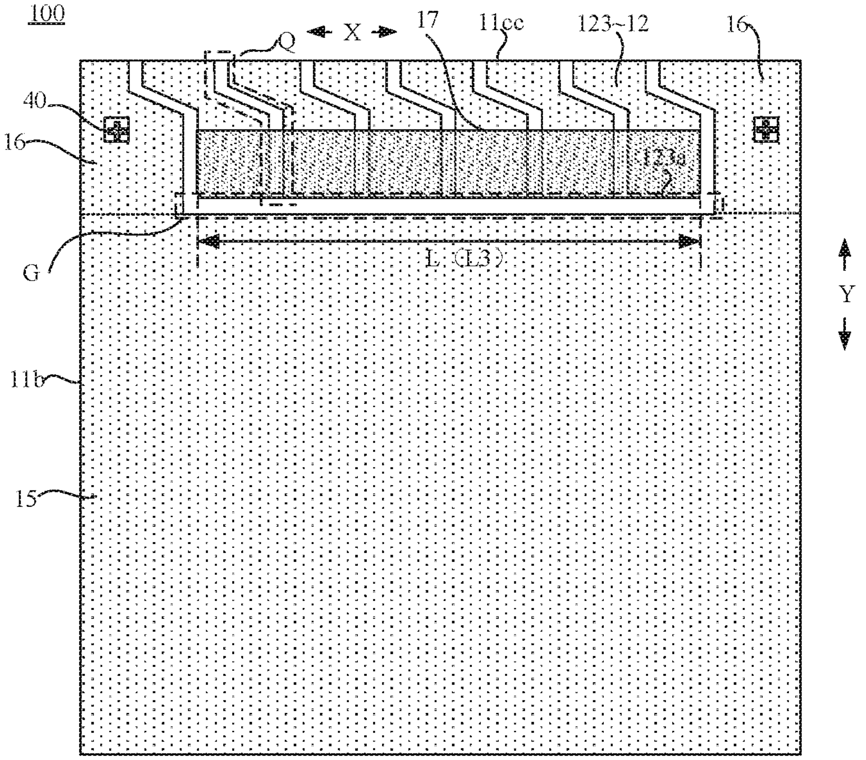
FIG. 11B is a structural diagram of a second surface of a display panel, in accordance with some embodiments.

In some embodiments, referring to FIGS. 11A and 11B, the display panel 100 further includes a conductive adhesive 17, and the conductive adhesive 17 is disposed on the side of the isolation region G proximate to the selected side surface 11*cc*, and covers the bonding ends 123*a* of the plurality of third-segment wires 123. The dimension L3 of the conductive adhesive 17 in the first direction X is greater than or equal to the distance L between sides, away from each other, of the bonding ends 123*a* of two third-segment wires 123 that are closest to two side surfaces 11*c* of the substrate 11 adjacent to the selected side surface 11*cc* in the plurality of third-segment wires 123 in the first direction X. The dimension of the conductive adhesive 17 in the second direction Y is in a range of 1 mm to 2 mm. The conductive adhesive 17 may be, for example, an anisotropic conductive film (ACF).

For example, the dimension of the conductive adhesive 17 in the second direction Y may be 1 mm, 1.5 mm, or 2 mm.

In some embodiments, referring to FIGS. 11A and 11B, the display panel 100 further includes second electrostatic discharge structure(s) 16, and orthographic projection(s) of the second electrostatic discharge structure(s) 16 on the second surface 11*b* do not overlap with an orthographic projection of the conductive adhesive 17 on the second surface 11*b*. In this way, the electrical isolation between the conductive adhesive 17 and the second electrostatic discharge structure 16 can be ensured. Thus, it is possible to avoid connection between the conductive adhesive 17 and the second electrostatic discharge structure 16, and avoid affecting signal transmission.

For example, referring to FIG. 11A, the dimension L3 of the conductive adhesive 17 in the first direction X is greater than the distance L between the sides, away from each other, of the first bonding end 123*a*1 and the second bonding end 123*a*2 in the first direction X.

For example, referring to FIG. 11B, the dimension L3 of the conductive adhesive 17 in the first direction X is equal to the distance L between the sides, away from each other, of the first bonding end 123*a*1 and the second bonding end 123*a*2 in the first direction X.

In FIGS. 11A and 11B, the dimension of the isolation region G in the second direction Y is equal to the dimension of the gap between the two adjacent third-segment wires 123 as an example to illustrate the positional relationship between the conductive adhesive 17 and the second electrostatic discharge structure 16, and it can be seen from the figures that the orthographic projection of the conductive adhesive 17 on the second surface 11*b* does not overlap with the orthographic projection of the second electrostatic discharge structure 16 on the second surface 11*b*. The dimension of the isolation region G in the second direction Y is greater than the distance between two adjacent third-segment wires 123, and it can also be known that the orthographic projection of the conductive adhesive 17 on the second surface 11*b* does not overlap with the orthographic projection of the second electrostatic discharge structure 16 on the second surface 11*b*. Similarly, in the case where the substrate 11 includes the mark exposure region H, the orthographic projection of the conductive adhesive 17 on the second surface 11*b* does not overlap with the orthographic projection of the second electrostatic discharge structure 16 on the second surface 11*b*. Thus, it may be possible to avoid the connection between the conductive adhesive 17 and the second electrostatic discharge structure 16, and avoid affecting signal transmission, which will not be repeated here.

Figure 12:
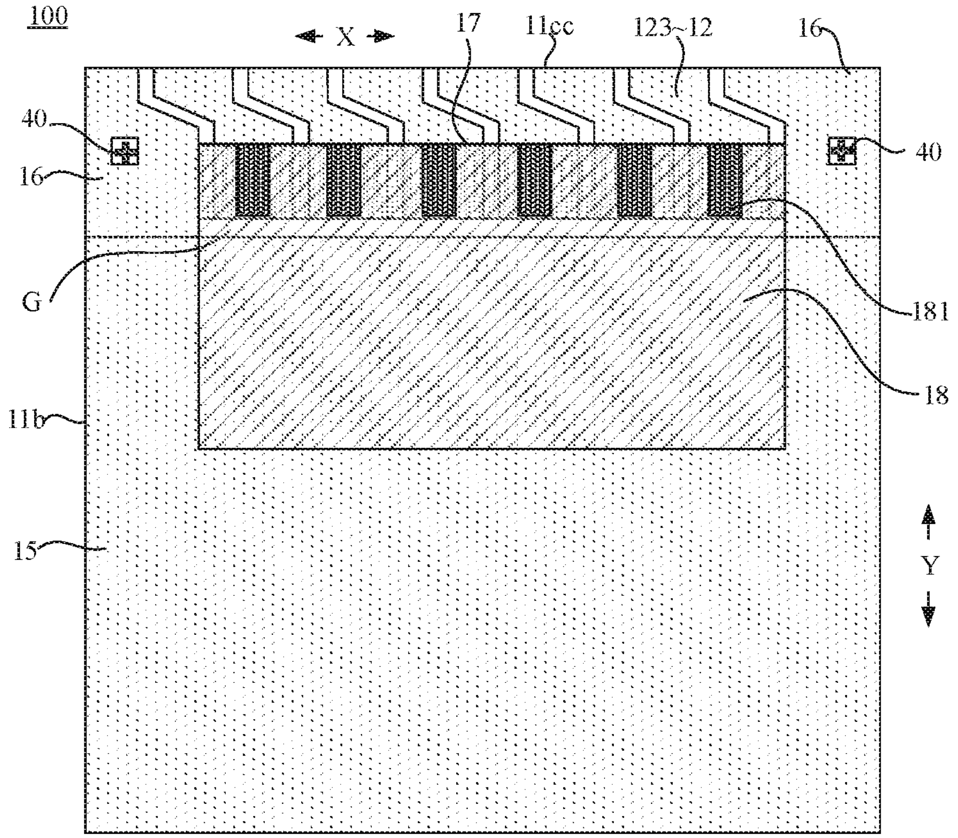
FIG. 12 is a structural diagram of a second surface of a display panel, in accordance with some embodiments.

In some embodiments, referring to FIG. 12, the display panel 100 further includes a FPC 18, and the FPC 18 is disposed on a side of the conductive adhesive 17 away from the substrate 11. The FPC 18 includes a plurality of bonding terminals 181, each of the plurality of bonding terminals 181 is electrically connected to the bonding end 123*a* of one of the plurality of third-segment wires 123 through the conductive adhesive 17 in a one-to-one correspondence; the length of the third-segment wire 123 in the second direction Y is greater than the length of the bonding terminal 181 in the second direction Y, and the plurality of third-segment wires 123 are configured to be bonded to the FPC 18. The orthographic projections of the plurality of bonding terminals 181 on the second surface 11*b* do not overlap with the orthographic projection of the first electrostatic discharge structure 15 on the second surface 11*b*. That is, the plurality of bonding terminals 181 are electrically isolated from the first electrostatic discharge structure 15, which may avoid the connection between the plurality of bonding terminals 181 and the first electrostatic discharge structure 15, and avoid affecting signal transmission.

In some embodiments, referring to FIG. 12, the orthographic projections of the plurality of bonding terminals 181 on the second surface 11*b* do not overlap with the orthographic projection of the second electrostatic discharge structure 16 on the second surface 11*b*. That is, the plurality of bonding terminals 181 are electrically isolated from the second electrostatic discharge structure 16, which may avoid the connection between the plurality of bonding terminals 181 and the second electrostatic discharge structure 16, and avoid affecting signal transmission.

A display device provided in some embodiments of the present disclosure will be introduced bellow, and FIGS. 13, 14, 15 and 16 are structural diagrams of the display device.

Figure 13:
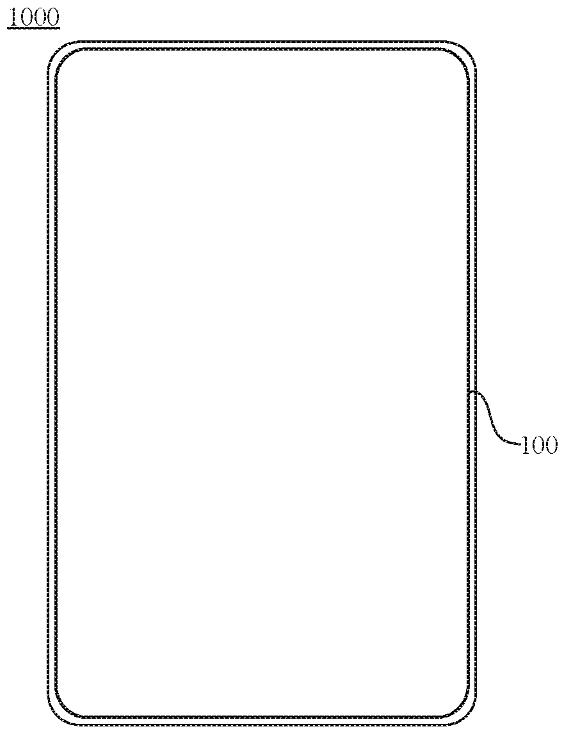
FIG. 13 is a structural diagram of a display device, in accordance with some embodiments of the present disclosure.
Figure 14:
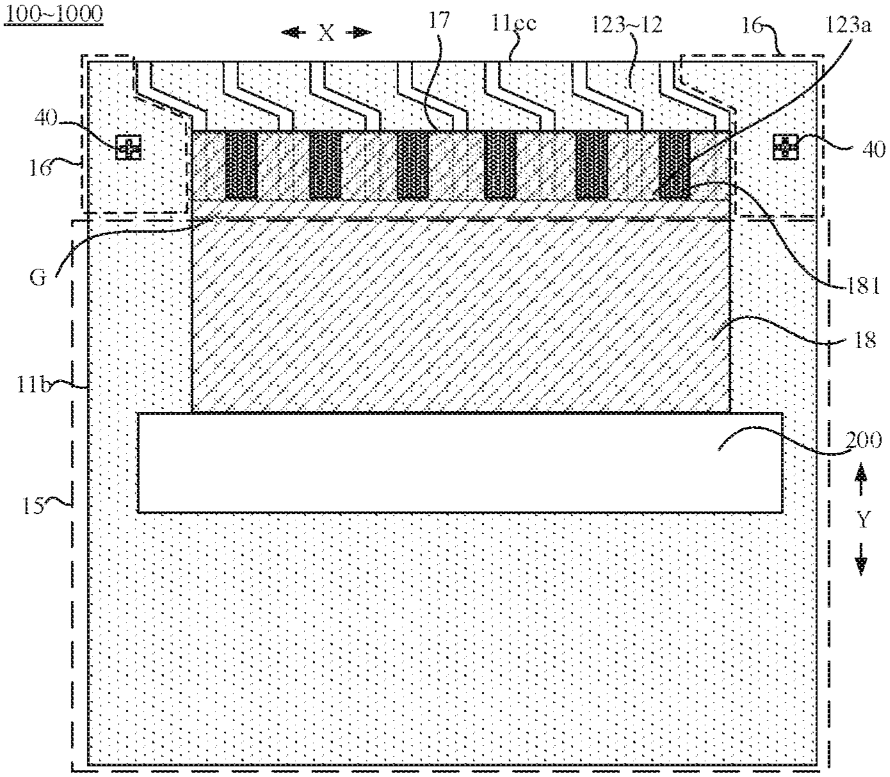
FIG. 14 is a structural diagram of another display device, in accordance with some embodiments of the present disclosure.

As shown in FIGS. 13 and 14, some embodiments of the present disclosure further provide a display device 1000, which includes the display panel 100 as described in any one of the above embodiments and a driving circuit board 200. The driving circuit board 200 is disposed on the second surface 11*b* of the substrate 11 of the display panel 100, and the driving circuit board 200 is electrically connected to the plurality of first electrodes 13 of the display panel 100 through the FPC and the plurality of connection wires 12 of the display panel 100.

For example, as shown in FIG. 14, after the driving circuit board 200 is connected to an end of the FPC 18, the other end of the FPC 18 is connected to the bonding ends 123*a* of the third-segment wires 123 of the plurality of connection wires 12.

For example, referring to FIG. 2C, in the case where the substrate of the display panel includes two selected side surfaces, the plurality of connection wires are divided into two sets; two FPCs 18 are respectively connected to two sides of the driving circuit board 200, and the other end of each FPC 18 is connected to the bonding ends 123*a* of the third-segment wires 123 of the plurality of connection wires 12. In some examples, two FPCs 18 and the plurality of connection wires 12 connected thereto are arranged symmetrically.

Referring to FIG. 14 and in combination with FIG. 2D, the driving circuit board 200 is bonded to the non-display surface of the display panel 100. That is, the driving circuit board 200 is bonded to the second surface 11*b* of the substrate 11. The light-emitting device 14 located on the display surface of the display panel 100 (the first surface 11*a* of the substrate 11) is electrically connected to the driving circuit board 200 through the first-segment wire 121, the second-segment wire 122 and the third-segment wire 123. In this way, the frame of the display device 1000 may be reduced, and the screen-to-body ratio of the display device 1000 can be increased, so as to facilitate the realization of a seamless tiling effect.

Referring to FIGS. 2A and 2C, two sets of connection wires are disposed on opposite sides of the display panel 100, respectively, which has the same technical effects as the display panel provided in FIG. 14, can also improve signal transmission ability, and has a better display effect.

The display device 1000 adopts the display panel 100 provided in the embodiments described above, and has the same technical effects as the display panel 100, which will not be detailed here.

Figure 15:
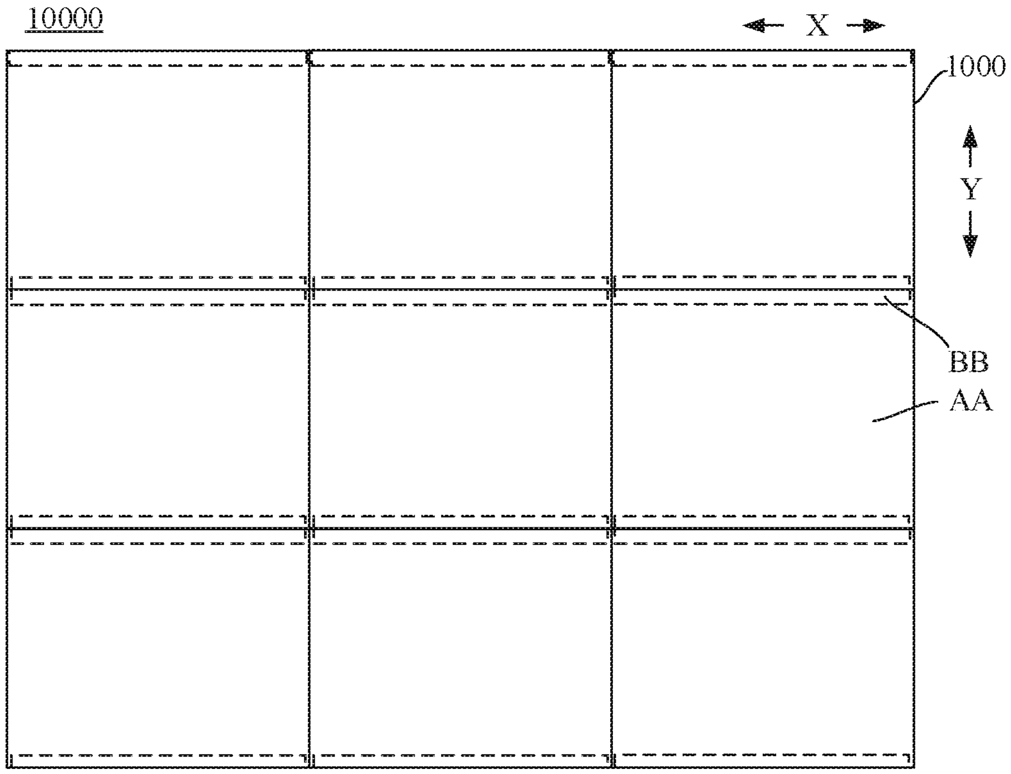
FIG. 15 is a plan view showing a structure of a tiled display apparatus, in accordance with some embodiments of the present disclosure.
Figure 16:
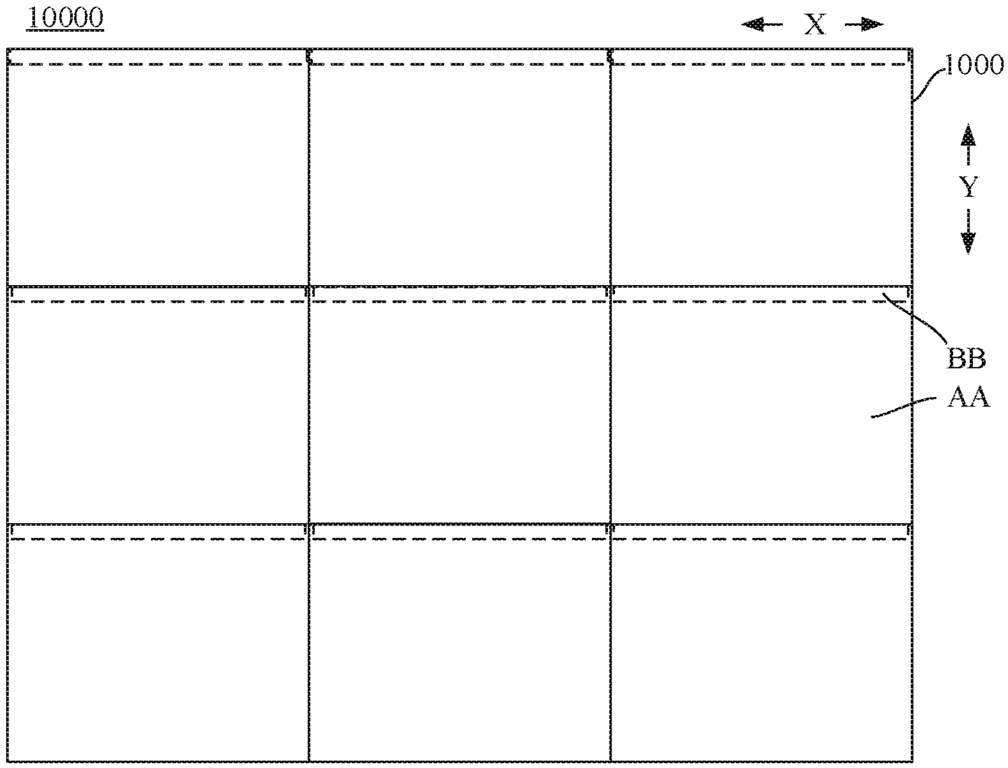
FIG. 16 is a plan view showing a structure of another tiled display apparatus, in accordance with some embodiments of the present disclosure.

Some embodiments of the present disclosure further provide a tiled display apparatus 10000, as shown in FIGS. 15 and 16, the tiled display apparatus 10000 includes a plurality of display devices 1000 provided in the embodiments described above.

For example, the plurality of display devices 1000 in the tiled display apparatus 10000 are arranged in an array.

For example, as shown in FIGS. 15 and 16, the display device 1000 is in a shape of a rectangle.

In the display panel 100, the plurality of first electrodes 13 are arranged side by side in the first direction X, correspondingly, the plurality of connection wires 12 are also arranged side by side in the first direction X. Another direction parallel to the display surface of the display device 1000 and perpendicular to the first direction X is referred to as the second direction Y. The display device 1000 includes a plurality of side surfaces. Hereinafter, a side surface, close to the peripheral area BB of the substrate 11, in the plurality of side surfaces of the display device 1000 is referred to as a selected side surface of the display device 1000 for description.

For example, as shown in FIG. 2A, the substrate 11 includes the display area AA and two peripheral areas BB located on opposite sides of the display area AA. The plurality of connection wires 12 are equally divided into two sets, which are disposed close to the two peripheral areas BB of the substrate 11, respectively; and the plurality of first electrodes 13 are equally divided into two sets, which are disposed close to the two peripheral areas BB of the substrate 11.

Further, as shown in FIG. 15, when the plurality of display devices 1000 each including the display panel 100 shown in FIG. 2A are tiled, selected side surfaces of two adjacent display devices 1000 are arranged in the first direction X. In this way, in the display devices 1000 arranged in a row in the first direction X, there is basically no tiling gap between two adjacent display devices 1000 in the first direction X; and in the display devices 1000 arranged in a row in the second direction Y, there is a tiling gap between two adjacent display devices 1000. That is, the dimension of the tiling gap between two adjacent display devices in the display devices 1000 arranged in a row in the first direction X is less than the dimension of the tiling gap between two adjacent display devices 1000 in the display devices 1000 arranged in a row in the second direction Y.

However, the dimension of the peripheral area BB in the second direction Y is very small, and therefore, when the tiled display device 10000 is actually viewed, the tiling gap between two adjacent display devices 1000 is difficult to be found by the eyes within the viewing distance. Thus, a display image of the tiled display device 10000 is relatively complete and can present a better display effect.

For example, as shown in FIG. 1, the display panel 100 includes the display area AA and the peripheral area BB located on one side of the display area AA, and the plurality of connection wires 12 and the plurality of first electrodes 13 are arranged close to the peripheral area BB of the substrate 11.

Further, as shown in FIG. 16, when the plurality of display devices 1000 each including the display panel 100 shown in FIG. 2D are tiled, selected side surfaces of two adjacent display devices 1000 are arranged in the first direction X. The effects that the display device 1000 can achieve are similar to those of the display device 1000 shown in FIG. 15, and will not be repeated here.

The tiled display apparatus 10000 adopts the display device 1000 provided in the embodiments described above, and has the same technical effects as the display device 1000, which will not be detailed here.

In another aspect, a method for manufacturing the display panel 100 is provided. FIGS. 18A to 18G are process diagrams in the manufacturing process of the display panel 100.

Figure 17:
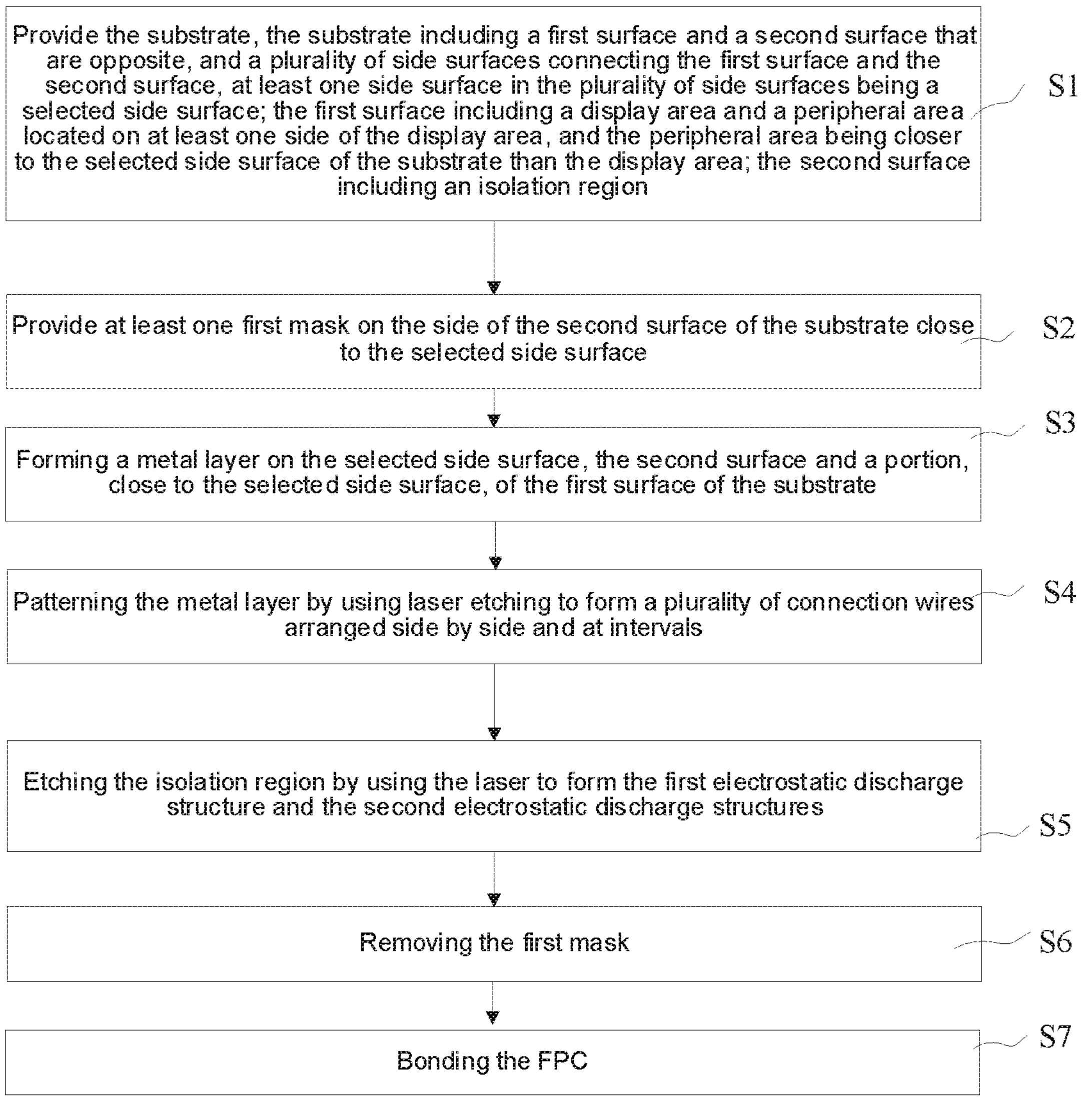
FIG. 17 is a flowchart of a method for manufacturing a display panel, in accordance with some embodiments of the present disclosure.

In some embodiments, as shown in FIG. 17, the method for manufacturing the display panel 100 includes steps S1 to S7.

In S1, the substrate 11 is provided.

Figure 18A:
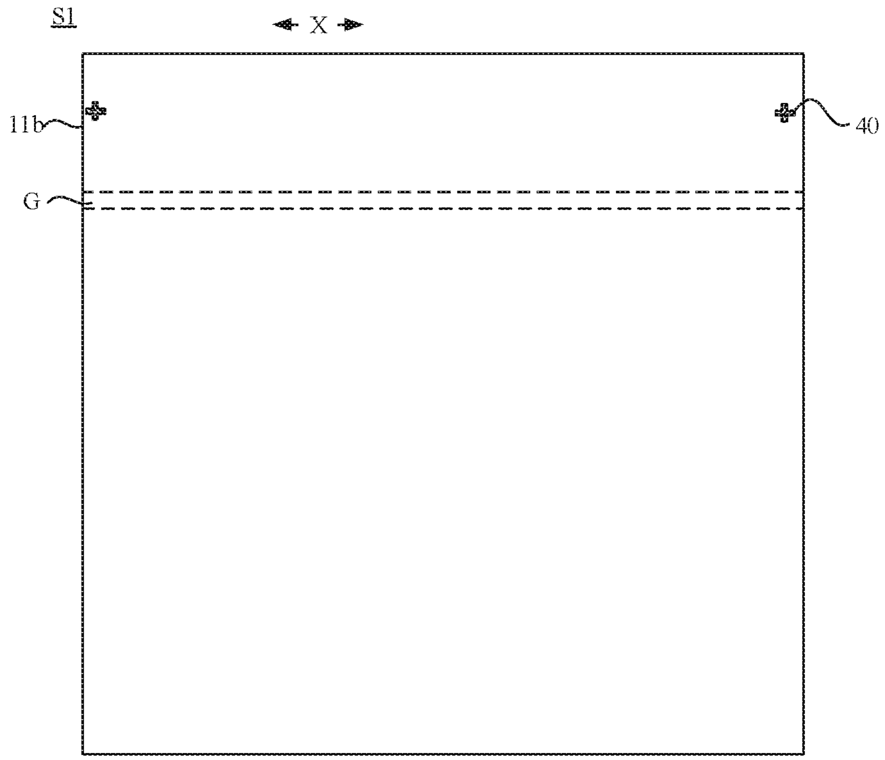
FIG. 18A is a process diagram of a method for manufacturing a display panel, in accordance with some embodiments of the present disclosure.

As shown in FIGS. 1 and 18A, the substrate 11 includes a first surface 11*a* and a second surface 11*b* that are opposite, and a plurality of side surfaces 11*c* connecting the first surface 11*a* and the second surface 11*b*, and at least one side surface 11*c* in the plurality of side surfaces 11*c* is a selected side surface 11*cc*. The first surface 11*a* includes a display area AA and a peripheral area BB located on at least one side of the display area AA. The peripheral area BB is closer to the selected side surface 11*cc* of the substrate 11 than the display area AA. The second surface 11*b* includes an isolation region G.

For example, referring to FIG. 18A, at least one alignment mark 40 is disposed on the first surface 11*a* of the substrate 11. According to the foregoing description, it can be seen that the material of the substrate 11 is a rigid material such as glass or quartz material, and the substrate 11 is a transparent substrate 11. Thus, on the side of the second surface 11*b* of the substrate 11, the location of the alignment mark 40 can be clearly observed through the transparent substrate 11, which facilitates accurate alignment in subsequent processes.

In S2, at least one first mask 20 is provided on the side of the second surface 11*b* of the substrate 11 close to the selected side surface 11*cc*.

Figure 18B:
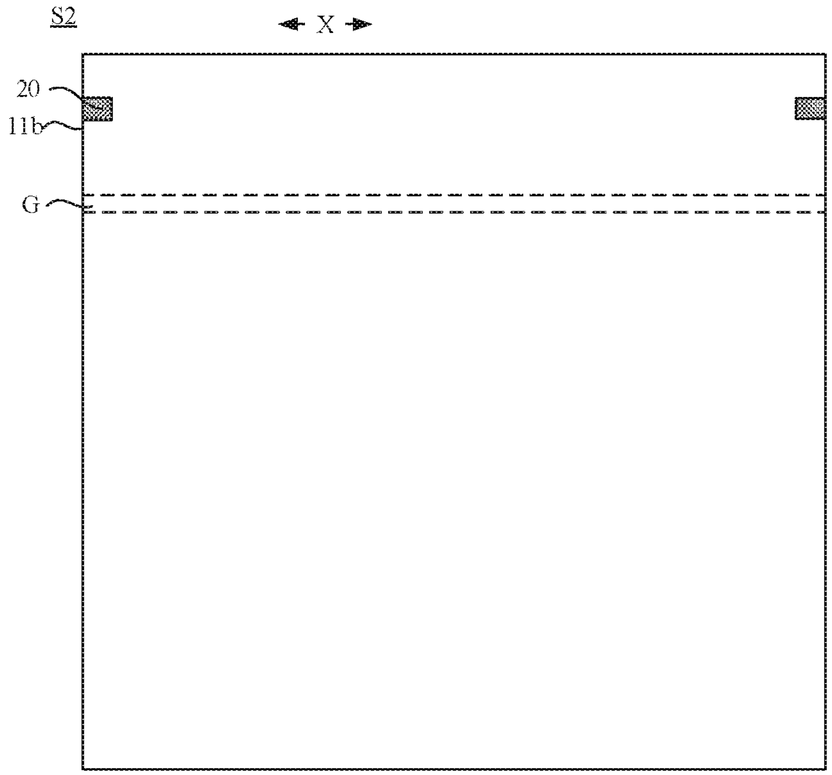
FIG. 18B is another process diagram of a method for manufacturing a display panel, in accordance with some embodiments of the present disclosure.

As shown in FIG. 18B, the orthographic projection of each first mask 20 on the second surface 11*b* covers at least one alignment mark (one or more alignment marks). For example, the orthographic projection of each first mask 20 on the second surface 11*b* covers one alignment mark.

For example, the first mask 20 may be a small magnetic pillar or an adhesive tape. The first mask 20 is attached to the second surface 11*b* to achieve precise alignment in the masking process.

Figure 18C:
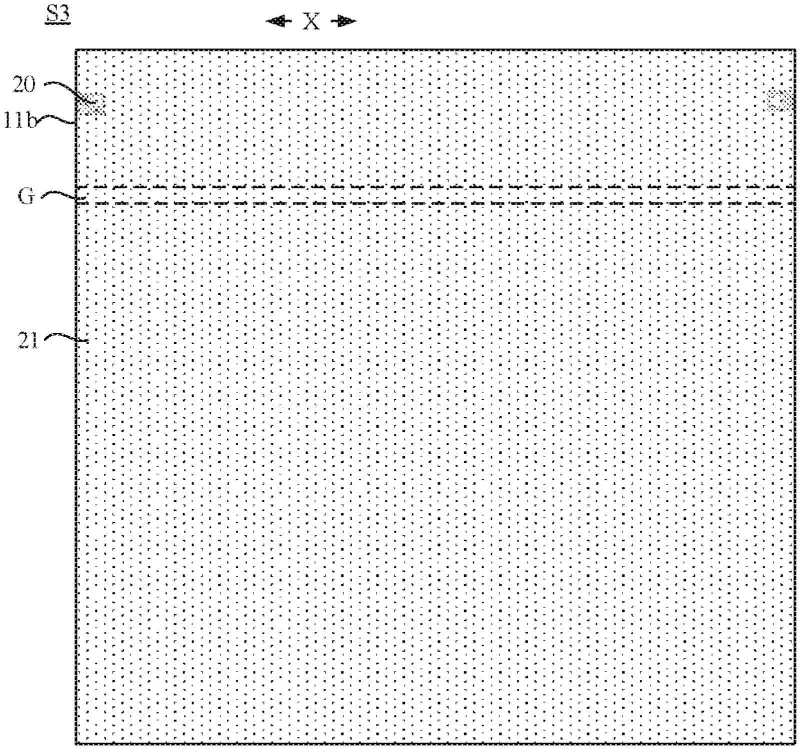
FIG. 18C is yet another process diagram of a method for manufacturing a display panel, in accordance with some embodiments of the present disclosure.

In S3, referring to FIGS. 1 and 18C, a metal layer 21 is formed on the selected side surface 11*cc*, the second surface 11*b* and a portion, close to the selected side surface 11*cc*, of the first surface 11*a* of the substrate 11. The metal layer 21 is the metal coating layer mentioned above.

For example, the metal layer is disposed on the second surface 11*b* of the substrate 11, and the metal layer is also disposed on the surface of the first mask 20 away from the second surface 11*b* of the substrate 11.

In the above step, the metal layer 21 is formed by, for example, a three-dimensional sputtering coating process, specifically, a physical vapor deposition (PVD) sputtering coating process.

In S4, the metal layer 21 is patterned by using laser etching to form a plurality of connection wires 12 arranged side by side and at intervals.

Figure 18D:
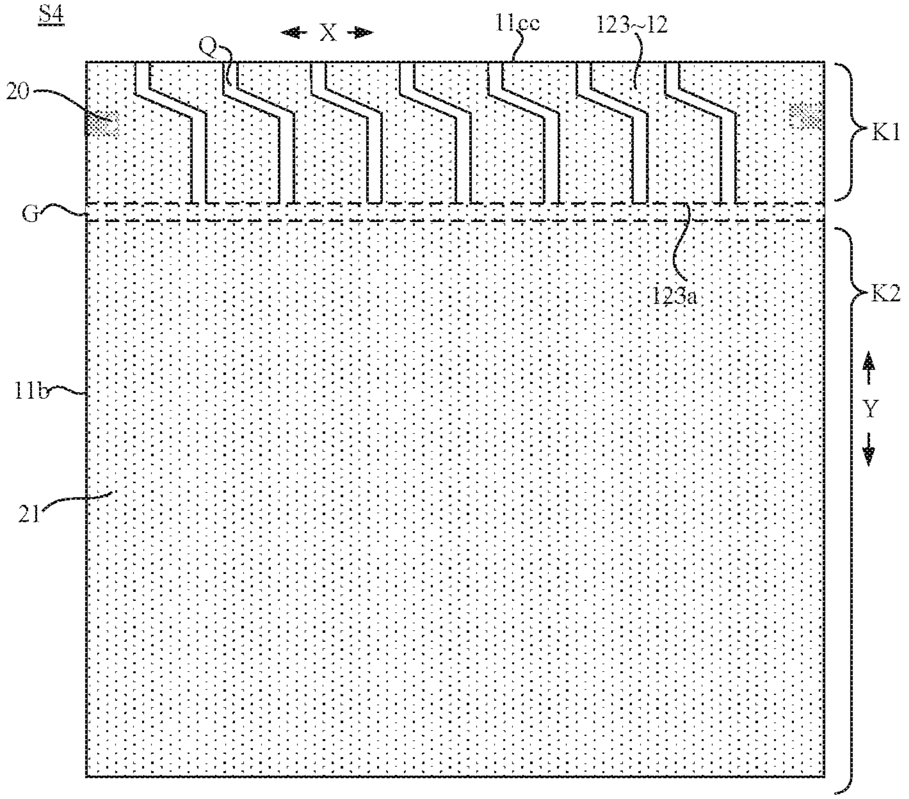
FIG. 18D is yet another process diagram of a method for manufacturing a display panel, in accordance with some embodiments of the present disclosure.

As shown in FIGS. 1 and 18D, each connection wire 12 in the plurality of connection wires 12 includes a first-segment wire 121, a second-segment wire 122 and a third-segment wire 123 connected in sequence, the first-segment wire 121 is located on the first surface 11*a*, the second-segment wire 122 is located on the selected side surface 11*cc*, and the third-segment wire 123 is located on the second surface 11*b*; the second surface 11*b* includes a first region K1, an isolation region G, and a second region K2 arranged in sequence in a direction away from the selected side surface 11*cc*, and a plurality of third-segment wires 123 are located in the first region K1.

In the above step, as shown in FIGS. 3A and 3B, the plurality of connection wires 12 formed by laser etching for the metal layer 21 are independently separated, and any two connection wires 12 in the plurality of connection wires 12 has a spacing region Q therebetween. A region corresponding to the portion of the metal layer 21 removed by the laser etching during the laser etching process is referred to as a region to be removed. After the portion of the metal layer 21 corresponding to the region to be removed is removed by etching, the obtained spacing between adjacent connection wires 12 is the spacing region Q between adjacent connection wires 12.

For example, both sides of the third-segment wires 123 of the plurality of connection wires 12 in the first direction X are also etched by laser, so as to ensure that each connection wire is independent.

In S5, the portion of the metal layer 21 located in the isolation region G is etched by using the laser to form the first electrostatic discharge structure 15 and the second electrostatic discharge structure(s) 16.

Figure 18E:
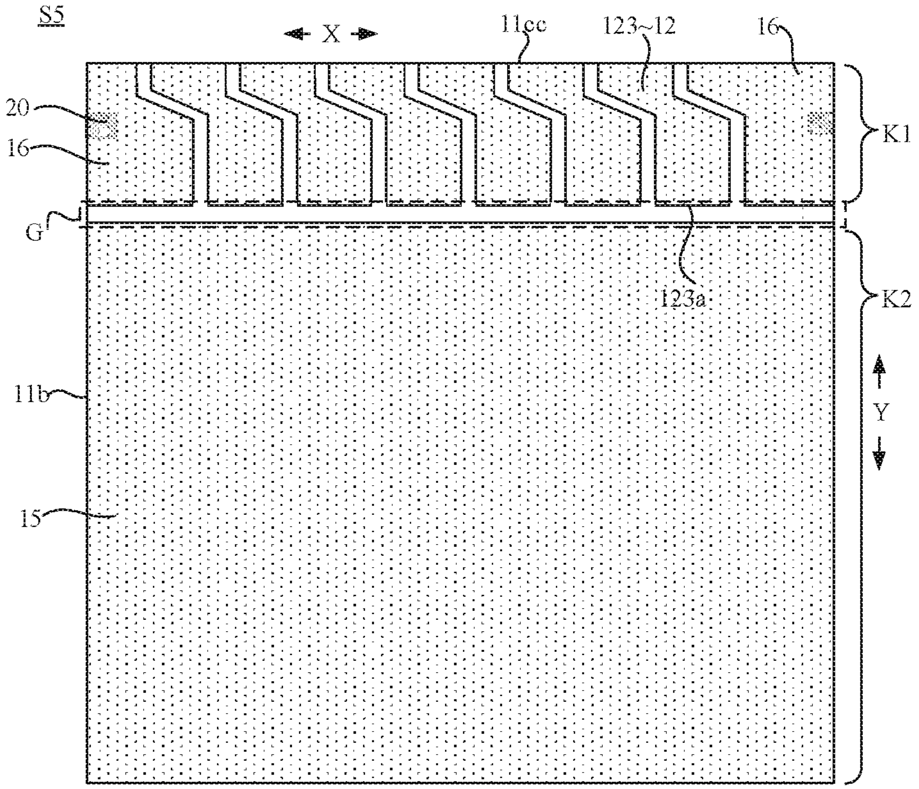
FIG. 18E is yet another process diagram of a method for manufacturing a display panel, in accordance with some embodiments of the present disclosure.

Referring to FIG. 18E, the second surface 11*b* includes the first region K1, the isolation region G, and the second region K2 arranged in sequence in the direction away from the selected side surface 11*cc*; the portion of the metal layer 21 located in the second region K2 is the first electrostatic discharge structure 15, the portion of the metal layer 21 located in the isolation region G is removed to expose the second surface 11*b*.

For example, referring to FIGS. 5A, 6A, 7A and 18E, the second region K2 is a region on the side of the isolation region G away from the selected side surface 11*cc*, and the dimension of the second region K2 in the first direction X is equal to that of the second surface 11*b* in the first direction X; the first region K1 is a region of the second surface 11*b* except the isolation region G and the second region K2, and in the first region K1, portions on both sides of the third-segment wires 123 of the plurality of connection wires 12 in the first direction X are the second electrostatic discharge structures 16. The second electrostatic discharge structures 16 are electrically isolated from the third-segment wires 123 of the plurality of connection wires 12, and the isolation region G is located between the plurality of third-segment wires 123 and the first electrostatic discharge structure 15. The isolation region G is configured to separate the plurality of third-segment wires 123 from the first electrostatic discharge structure 15, so that the two are electrically isolated, which may avoid the connection between the plurality of third-segment wires 123 through the first electrostatic discharge structure 15, and avoid affecting the signal transmission.

For example, referring to FIG. 18E, the first mask 20 is located in the first region K1, and the second electrostatic discharge structure 16 covers the first mask 20.

In S6, the first mask 20 is removed.

Figure 18F:
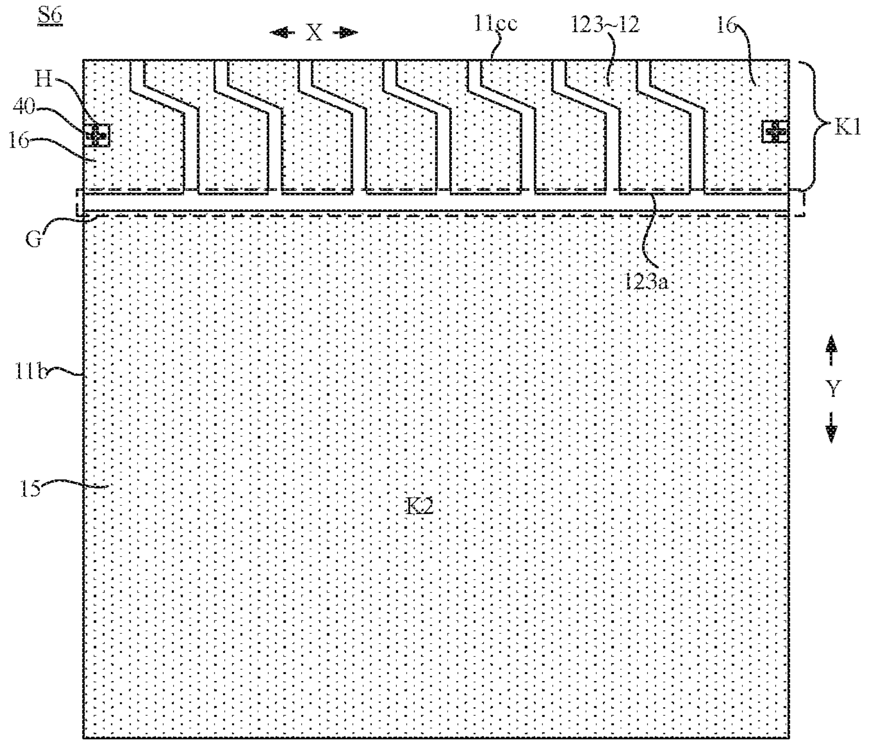
FIG. 18F is yet another process diagram of a method for manufacturing a display panel, in accordance with some embodiments of the present disclosure.

Referring to FIG. 18F, after the first mask 20 is removed, the alignment mark 40 is exposed, so that the alignment mark 40 can be identified during bonding, which facilitates accurate alignment.

It should be noted that, as can be seen from the foregoing, the first mask 20 may be the magnetic small pillar or adhesive tape, and the first mask 20 is attached to the second surface 11*b*; and therefore, when the first mask 20 is removed, it is only necessary to tear off the first mask 20 attached to the second surface 11*b* of the substrate 11. For example, the first mask has a force part for tearing (not shown in the figure). For example, in the case where the first mask is the adhesive tape, the adhesive tape is attached to the second surface shown in FIG. 18E, and further extends to the adjacent side surface. Thus, when the metal layer is formed in S3, the metal layer does not cover the portion of the adhesive tape located on the side surface; the portion of the adhesive tape located on the side surface can be used as the force part, and the entire tape can be torn off by acting on the force part. When the first mask 20 is torn off, the metal coating layer sputtered on the first mask 20 is also torn off; the second surface 11*b* of the substrate 11 is exposed after the first mask 20 is torn off, and the exposed region is referred to as the mark exposure region H. The area of the mark exposure region H is the area of the orthographic projection of the first mask 20 on the second surface 11*b* of the substrate 11. The alignment mark 40 can be exposed through the transparent substrate 11, which facilitates identification during the bonding process and alignment.

Figure 18G:
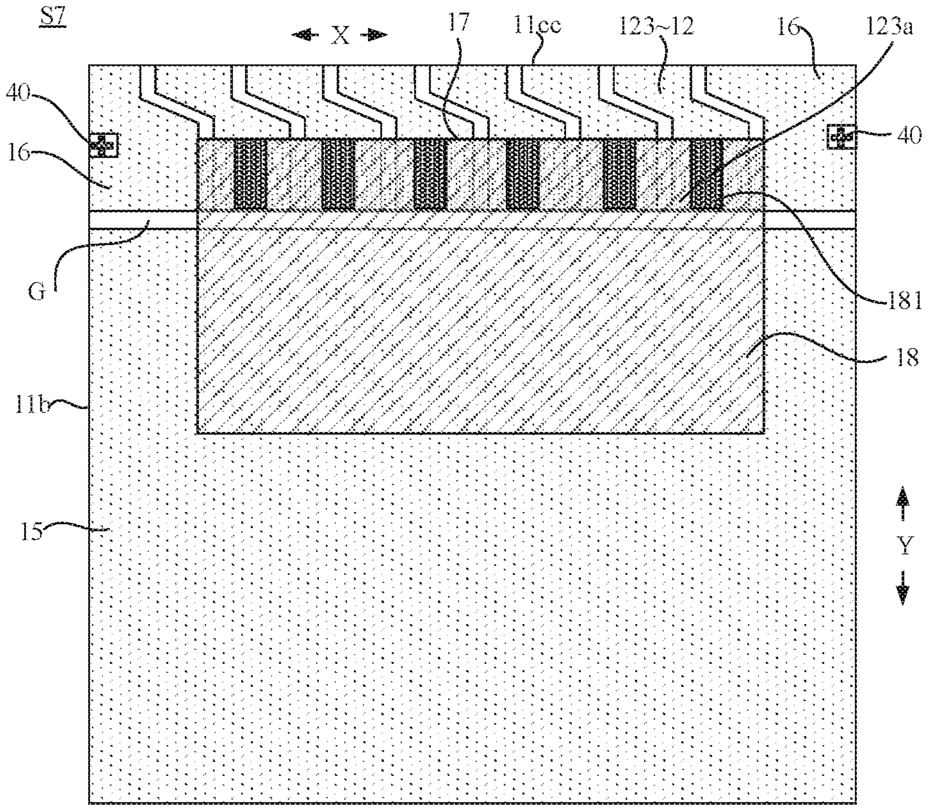
FIG. 18G is yet another process diagram of a method for manufacturing a display panel, in accordance with some embodiments of the present disclosure.

In S7, as shown in FIG. 18G, the FPC 18 is bonded.

For example, the FPC 18 is aligned with the region for bonding by identifying the alignment mark 40 to achieve precise alignment. The FPC 18 includes a plurality of bonding terminals 181, and each bonding terminal 181 in the plurality of bonding terminals 181 is electrically connected to the bonding end 123*a* of one third-segment wire 123 in the plurality of third-segment wires 123 through the conductive adhesive 17.

It should be noted that the display panel manufactured by the above method is the display panel shown in FIG. 3A. Since both the isolation region and the spacing region are obtained by laser etching for the metal layer, the dimension d1 of the isolation region in the second direction Y is equal to the distance d2 between two adjacent third-segment wires.

Figure 19:
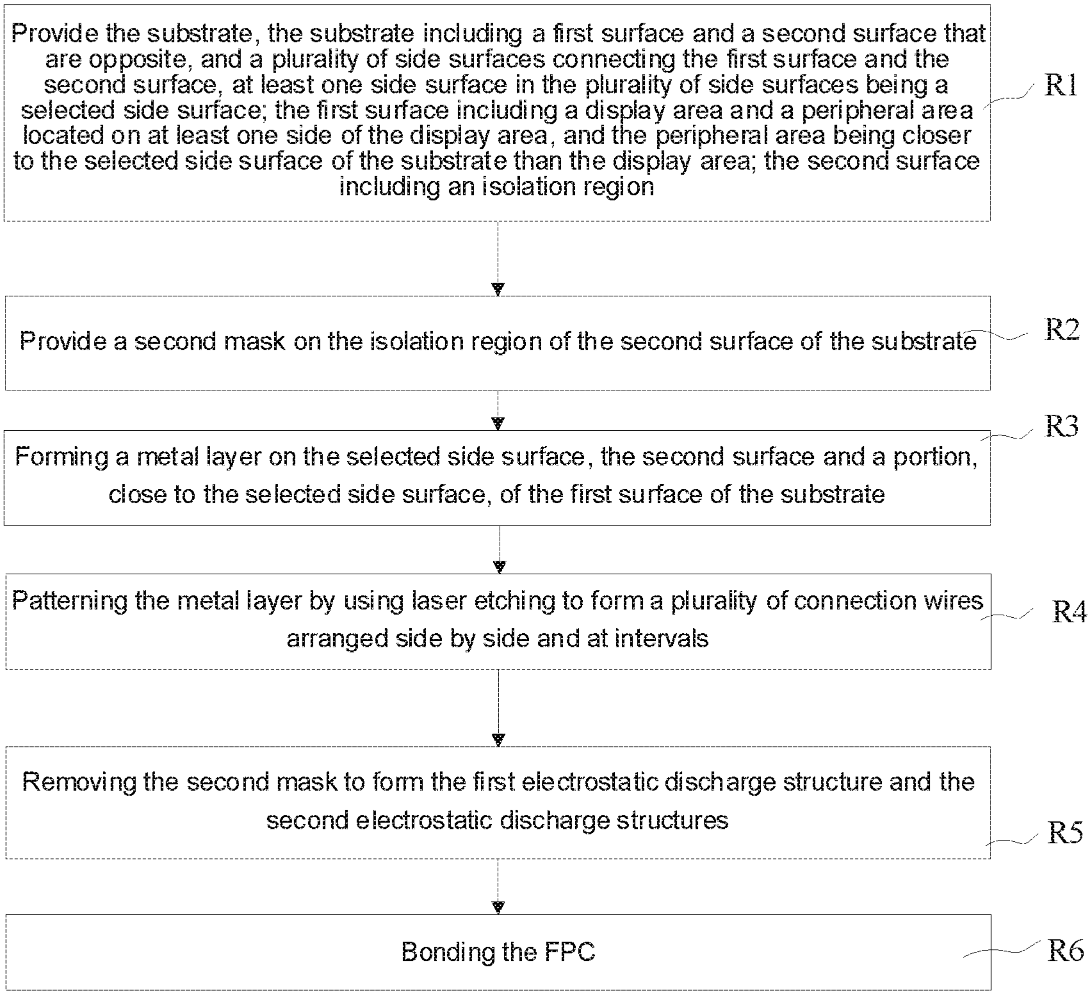
FIG. 19 is a flowchart of a method for manufacturing another display panel, in accordance with some embodiments of the present disclosure.

In other embodiments, another manufacturing method for the display panel 100 is provided. FIGS. 20A to 20F are process diagrams in the manufacturing process of the display panel 100. As shown in FIG. 19, the manufacturing steps of the display panel 100 include R1 to R6, which are specifically described as follows.

In R1, the substrate 11 is provided.

Figure 20A:
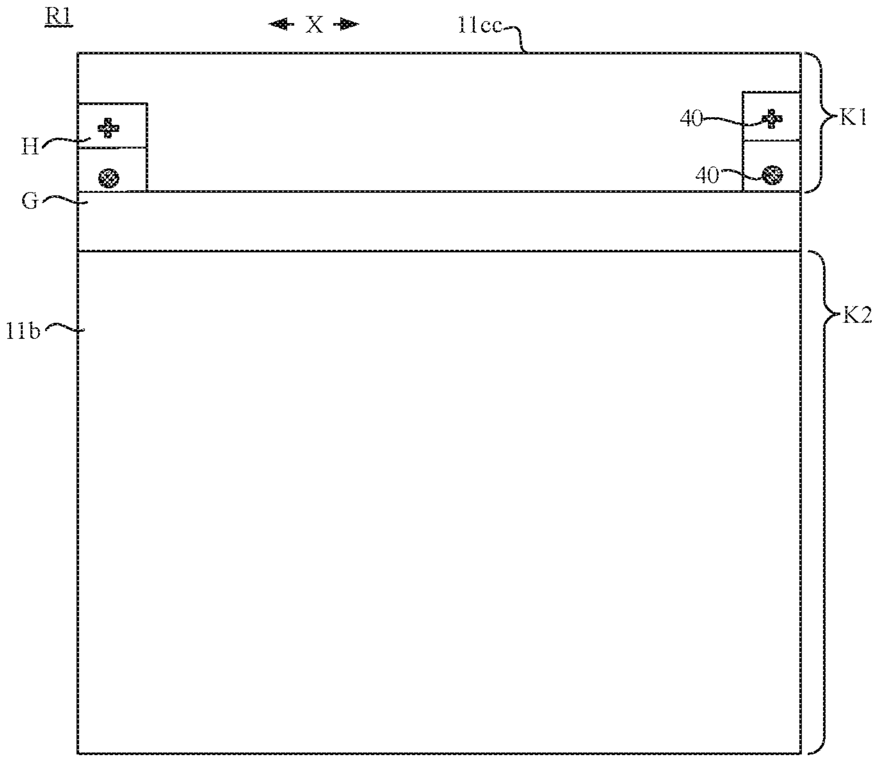
FIG. 20A is a process diagram of a method for manufacturing a display panel, in accordance with some embodiments of the present disclosure.

For example, as shown in FIGS. 1 and 20A, for this step, reference may be made to the description of providing the substrate 11 in the step S1, which will not be repeated here.

As shown in FIG. 20A, in the embodiments, two sets of alignment marks (i.e., four alignment marks) are provided on the first surface of the substrate. The second surface of the substrate includes a first region K1, an isolation region G, and a second region K2 arranged in sequence in the direction away from the selected side surface. The first region K1 includes mark exposure regions H, and the orthographic projection of each alignment mark on the second surface is within one mark exposure region H.

In R2, a second mask 30 is provided on the side of the second surface 11*b* of the substrate 11 close to the selected side surface 11*cc*.

Figure 20B:
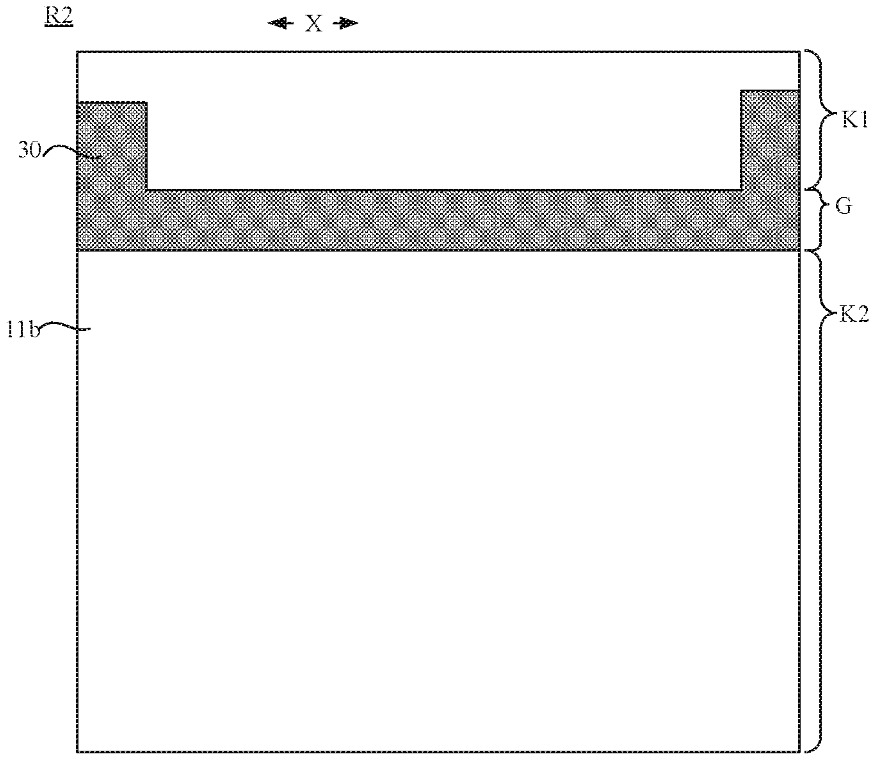
FIG. 20B is another process diagram of a method for manufacturing a display panel, in accordance with some embodiments of the present disclosure.

As shown in FIGS. 20A and 20B, the second mask 30 is located in the isolation region G.

In some other examples, the second mask is further located in the mark exposure regions H. In some embodiments, the isolation region communicates with the mark exposure regions H. Therefore, by providing the second mask 30, the isolation region and the mark exposure regions H are covered at the same time. In subsequent steps, portions of the metal layer in the isolation region and the mark exposure regions can be removed simultaneously.

For example, the material of the second mask 30 is an adhesive tape. The second mask 30 is attached to the second surface 11*b* to achieve precise alignment in the masking process.

Figure 20C:
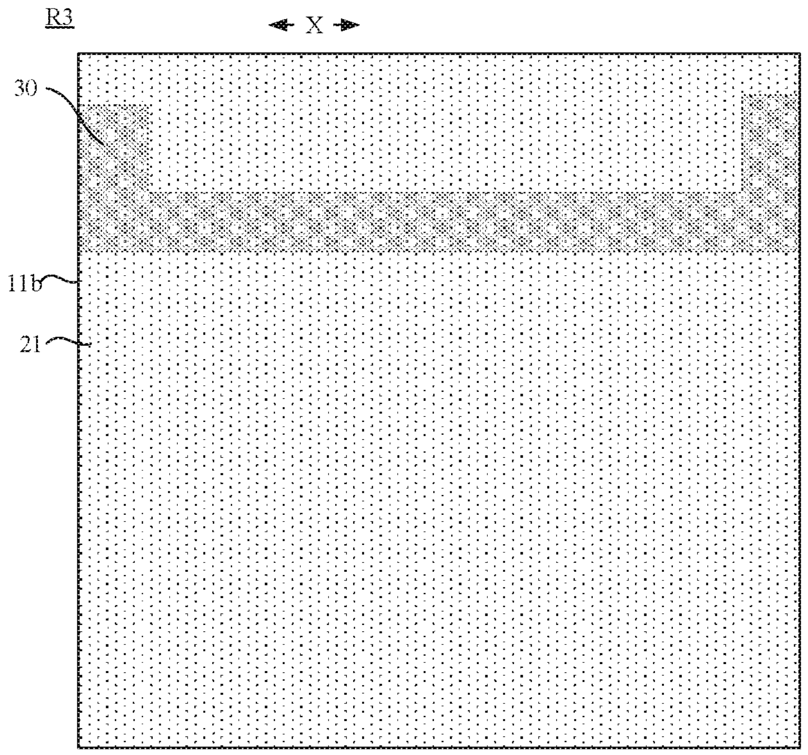
FIG. 20C is yet another process diagram of a method for manufacturing a display panel, in accordance with some embodiments of the present disclosure.

In R3, referring to FIGS. 1 and 20C, a metal layer 21 is formed on the selected side surface 11*cc*, the second surface 11*b* and a portion, close to the selected side surface 11*cc*, of the first surface 11*a* of the substrate 11.

For example, the metal layer is disposed on the second surface 11*b* of the substrate 11, and the metal layer is also disposed on the surface of the second mask 30 away from the second surface 11*b* of the substrate 11.

In the above step, the metal layer 21 is formed by, for example, a three-dimensional sputtering coating process, specifically, a physical vapor deposition (PVD) sputtering coating process.

In R4, the metal layer 21 is patterned by using laser etching to form a plurality of connection wires 12 arranged side by side and at intervals.

Figure 20D:
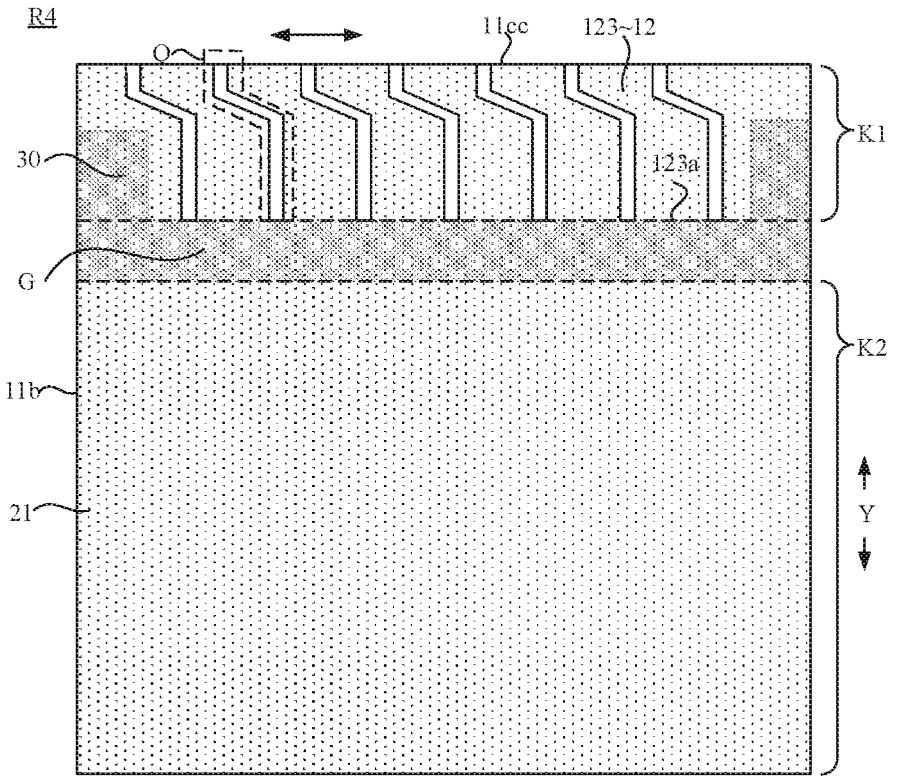
FIG. 20D is yet another process diagram of a method for manufacturing a display panel, in accordance with some embodiments of the present disclosure.

As shown in FIGS. 1 and 20D, each connection wire 12 in the plurality of connection wires 12 includes a first-segment wire 121, a second-segment wire 122 and a third-segment wire 123 connected in sequence, the first-segment wire 121 is located on the first surface 11*a*, the second-segment wire 122 is located on the selected side surface

11*cc*, and the third-segment wire 123 is located on the second surface 11*b*; the second surface 11*b* includes a first region K1, an isolation region G, and a second region K2 arranged in sequence in the direction away from the selected side surface 11*cc*, and a plurality of third-segment wires 123 are located in the first region K1.

In the above step, as shown in FIG. 20D, the plurality of connection wires 12 formed by laser etching for the metal layer 21 are independently separated, and any two connection wires 12 in the plurality of connection wires 12 has a spacing region Q therebetween. A region corresponding to the portion of the metal layer 21 removed by the laser etching during the laser etching process is referred to as a region to be removed. After the portion of the metal layer 21 corresponding to the region to be removed is removed by etching, the obtained spacing between adjacent connection wires 12 is the spacing region Q between adjacent connection wires 12.

For example, both sides of the third-segment wires 123 of the plurality of connection wires 12 in the first direction X are also etched by laser, so as to ensure that each connection wire is independent.

In R5, the second mask 30 is removed to form the first electrostatic discharge structure 15 and the second electrostatic discharge structures 16.

Figure 20E:
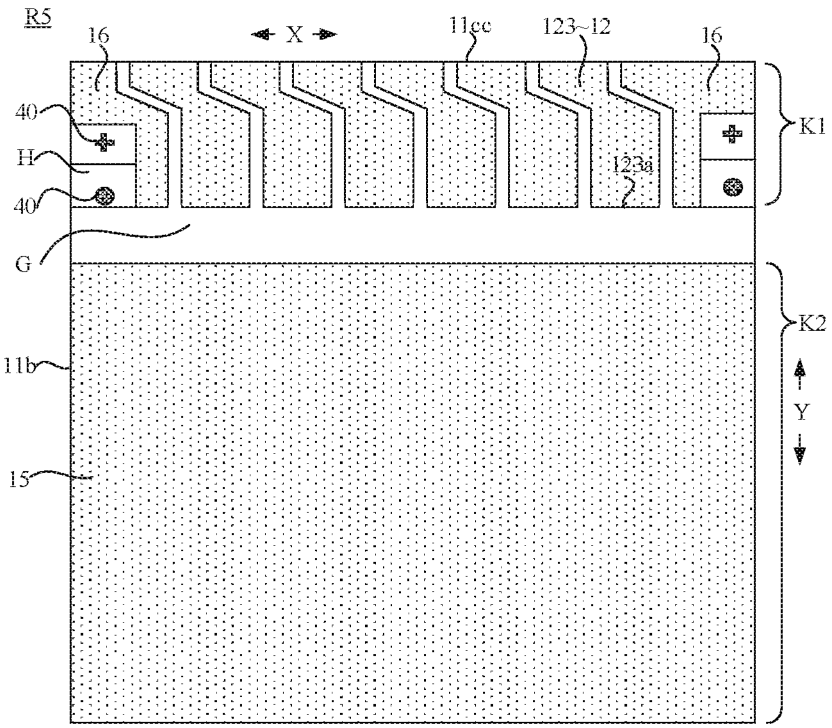
FIG. 20E is yet another process diagram of a method for manufacturing a display panel, in accordance with some embodiments of the present disclosure.

It should be noted that, referring to FIG. 20E, as can be seen from the foregoing, the second mask 30 is the adhesive tape, and the second mask 30 is attached to the second surface 11*b*; and therefore, when the second mask 30 is removed, it is only necessary to tear off the second mask 30 attached to the second surface 11*b* of the substrate 11. For example, the second mask has a force part for tearing (not shown in the figure). For example, in the case where the second mask is the adhesive tape, the adhesive tape is attached to the second surface shown in FIG. 20B, and further extends to the adjacent side surface. Thus, when the metal layer is formed in R3, the metal layer does not cover the portion of the adhesive tape located on the side surface; the portion of the adhesive tape located on the side surface can be used as the force part, and the entire tape can be torn off by acting on the force part. When the second mask 30 is torn off, the metal coating layer sputtered on the second mask 30 is also torn off; the second surface 11*b* of the substrate 11 is exposed after the second mask 30 is torn off, and the exposed region includes the mark exposure regions H and the isolation region G. The sum of the areas of the mark exposure regions H and the area of the isolation region G is the area of the orthographic projection of the second mask 30 on the second surface 11*b* of the substrate 11. The alignment mark 40 can be exposed through the transparent substrate 11, which facilitates identification and alignment.

For example, referring to FIG. 20E, the second surface 11*b* includes the first region K1, the isolation region G, and the second region K2 arranged in sequence in the direction away from the selected side surface 11*cc*, and the portion of the metal layer 21 located in the second region K2 is the first electrostatic discharge structure 15.

For example, referring to FIG. 20E, the second region K2 is a region on the side of the isolation region G away from the selected side surface 11*cc*, and the dimension of the second region K2 in the first direction X is equal to that of the second surface 11*b* in the first direction X. The first region K1 is a region of the second surface 11*b* except the isolation region G and the second region K2, and in the first region K1, portions on both sides of the third-segment wires 123 of the plurality of connection wires 12 in the first direction X are the second electrostatic discharge structures 16. The second electrostatic discharge structures 16 are electrically isolated from the third-segment wires 123 of the plurality of connection wires 12, and the orthographic projections of the second electrostatic discharge structures 16 on the second surface 11*b* of the substrate 11 do not overlap with the mark exposure regions H. The isolation region G is located between the plurality of third-segment wires 123 and the first electrostatic discharge structure 15. The isolation region G is configured to separate the plurality of third-segment wires 123 from the first electrostatic discharge structure 15, so that the two are electrically isolated, which may avoid the connection between the plurality of third-segment wires 123 through the first electrostatic discharge structure 15, and avoid affecting the signal transmission.

Figure 20F:
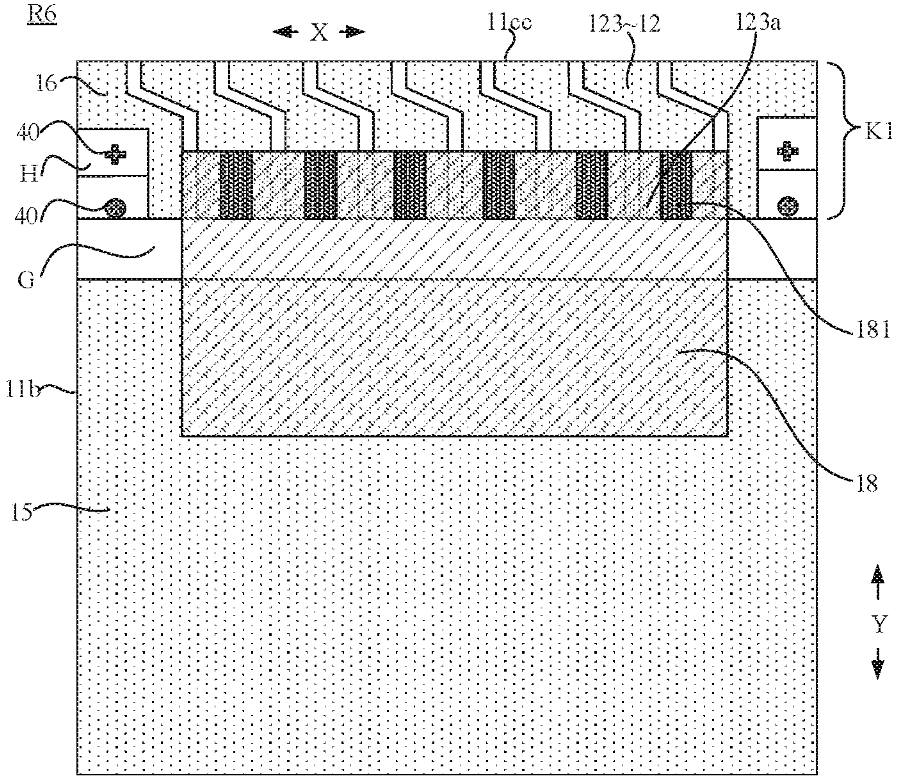
FIG. 20F is yet another process diagram of a method for manufacturing a display panel, in accordance with some embodiments of the present disclosure.

In R6, as shown in FIG. 20F, the FPC 18 is bonded.

For example, the FPC 18 is aligned with the region for bonding by identifying the alignment mark 40 to achieve precise alignment. The FPC 18 includes a plurality of bonding terminals 181, and each bonding terminal 181 in the plurality of bonding terminals 181 is electrically connected to the bonding end 123*a* of one third-segment wire 123 in the plurality of third-segment wires 123 through the conductive adhesive 17.

For example, the plurality of bonding terminals 181 included in FPC 18 shown in FIG. 20F are electrically isolated from the first electrostatic discharge structure 15, so as to avoid the connection between the plurality of bonding terminals 181 and the first electrostatic discharge structure 15, and avoid affecting the signal transmission.

It should be noted that the display panel manufactured by the above method is the display panel shown in FIG. 4. The isolation region G is obtained through the mask; and in order to realize the precise mask function, the size of the mask is relatively large. The mask spacing region is obtained by laser etching for the metal layer, so that the dimension d1 of the isolation region in the second direction Y is greater than the distance d2 between two adjacent third-segment wires.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:

a substrate including a first surface and a second surface that are opposite, and a plurality of side surfaces connecting the first surface and the second surface, wherein at least one side surface in the plurality of side surfaces is a selected side surface;

a plurality of connection wires arranged side by side at intervals, wherein the plurality of connection wires include a plurality of first-segment wires, a plurality of second-segment wires and a plurality of third-segment wires, each connection wire in the plurality of connection wires includes a first-segment wire of the plurality of first-segment wires, a second-segment wire of the plurality of second-segment wires and a third-segment wire of the plurality of third-segment wires connected in sequence; the first-segment wire is located on the first surface, the second-segment wire is located on the selected side surface, and the third-segment wire is located on the second surface;

a first electrostatic discharge structure disposed on the second surface, wherein the first electrostatic discharge structure is arranged on a side of the plurality of third-segment wires of the plurality of connection wires away from the selected side surface;

wherein the second surface includes an isolation region, the isolation region is located between the plurality of third-segment wires and the first electrostatic discharge structure, and the isolation region is configured to separate the plurality of connection wires from the first electrostatic discharge structure, so that the plurality of connection wires are electrically isolated from the first electrostatic discharge structure.

2. The display panel according to claim 1, wherein the third-segment wires of the plurality of connection wires are arranged in the first direction, and the isolation region extends in the first direction; ends of the third-segment wires away from the selected side surface are bonding ends, and a dimension of the isolation region in the first direction is greater than or equal to a distance between a side of a first bonding end away from a second bonding end and a side of the second bonding end away from the first bonding end in the first direction, wherein the first bonding end and the second bonding end are bonding ends of two third-segment wires that are farthest apart, respectively.

3. The display panel according to claim 2, wherein the dimension of the isolation region in the first direction is equal to a dimension of the second surface in the first direction.

4. The display panel according to claim 2, wherein a dimension of the isolation region in the second direction is equal to a distance between two adjacent third-segment wires, and the second direction is perpendicular to the first direction.

5. The display panel according to claim 4, wherein the dimension of the isolation region in the second direction is in a range of 10 μm to 2 mm.

6. The display panel according to claim 2, wherein a dimension of the isolation region in the second direction is greater than a distance between two adjacent third-segment wires, and the second direction is perpendicular to the first direction; or the dimension of the isolation region in the second direction is greater than the distance between two adjacent third-segment wires, and the second direction is perpendicular to the first direction; and the dimension of the isolation region in the second direction is in a range of 300 μm to 2 mm.

7. The display panel according to claim 1, wherein a thickness of the first electrostatic discharge structure is approximately equal to a thickness of the third-segment wire.

8. The display panel according to claim 7, wherein the display panel further comprises at least one second electrostatic discharge structure disposed on the second surface, wherein there are two second electrostatic discharge structures, and the two second electrostatic discharge structures are located on both sides of the plurality of third-segment wires in the first direction and are electrically isolated from the third-segment wires;

or, there are one second electrostatic discharge structure, and the second electrostatic discharge structure is located on any side of the plurality of third-segment wires in the first direction and is electrically isolated from the third-segment wires.

9. The display panel according to claim 8, wherein a dimension of the isolation region in the first direction is greater than or equal to a dimension of bonding ends of the plurality of third-segment wires in the first direction, and is less than a dimension of the second surface in the first direction; and the at least one second electrostatic discharge structure is connected to the first electrostatic discharge structure.

10. The display panel according to claim 9, wherein thicknesses of the first electrostatic discharge structure, the at least one second electrostatic discharge structure, and the third-segment wire are all substantially equal.

11. The display panel according to claim 1, wherein the display panel further comprises a plurality of first electrodes and at least one set of alignment marks disposed on the first surface of the substrate, and each set of alignment marks includes two alignment marks; the plurality of first electrodes are arranged in the first direction, each first electrode is electrically connected to a corresponding first-segment wire, and the two alignment marks in each set of alignment marks are located on both sides of the plurality of first electrodes in the first direction, respectively;

the second surface is provided with at least two mark exposure regions, each of the at least two mark exposure regions corresponds to an alignment mark in position, and an orthographic projection of the alignment mark on the second surface is located within the mark exposure region; and the mark exposure region exposes the second surface.

12. The display panel according to claim 11, wherein the mark exposure region communicates with the isolation region.

13. The display panel according to claim 2, wherein the display panel further comprises a conductive adhesive and a flexible printed circuit, the conductive adhesive is disposed on a side of the isolation region proximate to the selected side surface, and the flexible printed circuit is disposed on a side of the conductive adhesive away from the substrate; the flexible printed circuit includes a plurality of bonding terminals, and each of the plurality of bonding terminals is electrically connected to a bonding end of one of the plurality of third-segment wires through the conductive adhesive; and orthographic projections of the plurality of bonding terminals on the second surface are non-overlapping with an orthographic projection of the first electrostatic discharge structure on the second surface.

14. The display panel according to claim 13, wherein a dimension of the conductive adhesive in the first direction is greater than or equal to a distance between the side of the first bonding end away from the second bonding end and the side of the second bonding end away from the first bonding end in the first direction; and a dimension of the conductive adhesive in a second direction is in a range of 1 mm to 2 mm, wherein the second direction is perpendicular to the first direction.

15. The display panel according to claim 13, wherein the display panel further comprises a second electrostatic discharge structure, and an orthographic projection of the second electrostatic discharge structure on the second surface is non-overlapping with an orthographic projection of the conductive adhesive on the second surface.

16. The display panel according to claim 15, wherein orthographic projections of the plurality of bonding terminals on the second surface are non-overlapping with the orthographic projection of the second electrostatic discharge structure on the second surface.

17. A display device, comprising:

the display panel according to claim 1; and a driving circuit board disposed on the second surface of the substrate of the display panel, wherein the driving circuit board is electrically connected to the plurality of connection wires of the display panel.

18. A tiled display apparatus, comprising a plurality of display devices each according to claim 17, the plurality of display devices being tiled together.

19. A method for manufacturing a display panel, comprising:

providing a substrate, wherein the substrate includes a first surface and a second surface that are opposite, and a plurality of side surfaces connecting the first surface and the second surface, at least one side surface in the plurality of side surfaces is a selected side surface; and the second surface includes an isolation region; and forming a plurality of connection wires on the first surface, the second surface and the selected side surface of the substrate, and forming a first electrostatic discharge structure on the second surface, wherein the plurality of connection wires are arranged side by side at intervals; the plurality of connection wires include a plurality of first-segment wires, a plurality of second-segment wires and a plurality of third-segment wires, each connection wire in the plurality of connection wires includes a first-segment wire of the plurality of first-segment wires, a second-segment wire of the plurality of second-segment wires and a third-segment wire of the plurality of third-segment wires connected in sequence, the first-segment wire is located on the first surface, the second-segment wire is located on the selected side surface, and the third-segment wire is located on the second surface; the first electrostatic discharge structure is located on the second surface, and the first electrostatic discharge structure is arranged on a side of the plurality of third-segment wires of the plurality of connection wires away from the selected side surface; the isolation region is located between the plurality of third-segment wires and the first electrostatic discharge structure, and the isolation region is configured to separate the plurality of connection wires from the first electrostatic discharge structure, so that the plurality of connection wires are electrically isolated from the first electrostatic discharge structure.

20. The method for manufacturing the display panel according to claim 19, wherein forming the plurality of connection wires on the first surface, the second surface and the selected side surface of the substrate, and forming the first electrostatic discharge structure, includes:

forming a metal layer on the selected side surface, the second surface and a portion, close to the selected side surface, of the first surface of the substrate; and etching the metal layer to form the plurality of connection wires and the first electrostatic discharge structure, wherein the second surface includes a first region, the isolation region, and a second region arranged in sequence in a direction away from the selected side surface; and etching the metal layer includes removing a portion of the metal layer located in the isolation region by etching, a portion of the metal layer located in the second region serving as the first electrostatic discharge structure;

or, placing a mask on the second surface of the substrate, wherein the second surface includes the first region, the isolation region, and the second region arranged in sequence in the direction away from the selected side surface, and the mask is arranged on the isolation region;

forming the metal layer on the selected side surface, the second surface and the portion, close to the selected side surface, of the first surface of the substrate;

etching portions of the metal layer located on the first surface, the selected side surface and the first region of the second surface to form the plurality of connection wires; and removing the mask, the portion of the metal layer located in the second region serving as the first electrostatic discharge structure.

* * * * *